(12) United States Patent
Takeuchi

(10) Patent No.: US 7,940,094 B2
(45) Date of Patent: May 10, 2011

(54) SEMICONDUCTOR START CONTROL DEVICE, METHOD, AND SYSTEM

(75) Inventor: Atsushi Takeuchi, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/637,197

(22) Filed: Dec. 14, 2009

(65) Prior Publication Data

US 2010/0164565 A1  Jul. 1, 2010

(30) Foreign Application Priority Data

Dec. 26, 2008 (JP) ................................. 2008-333268

(51) Int. Cl.
*H03L 7/00* (2006.01)
(52) U.S. Cl. ..................... 327/143; 327/541; 327/77
(58) Field of Classification Search .................. 327/142, 327/143, 198
See application file for complete search history.

(56) References Cited

U.S. PATENT DOCUMENTS

| | | | |
|---|---|---|---|
| 5,936,443 A * | 8/1999 | Yasuda et al. ................. | 327/143 |
| 6,483,756 B2 | 11/2002 | Takeuchi et al. | |
| 6,642,757 B2 | 11/2003 | Ikehashi et al. | |
| 6,901,012 B2 | 5/2005 | Ikehashi et al. | |
| 6,914,461 B2 | 7/2005 | Kwon | |
| 7,116,603 B2 * | 10/2006 | Kanda et al. ............... | 365/225.7 |
| 7,200,051 B2 | 4/2007 | Takeuchi | |
| 7,602,225 B2 * | 10/2009 | Seo et al. ...................... | 327/198 |
| 2002/0033720 A1 | 3/2002 | Ikehashi et al. | |
| 2002/0054517 A1 | 5/2002 | Takeuchi et al. | |
| 2004/0046595 A1 | 3/2004 | Ikehashi et al. | |
| 2005/0276127 A1 | 12/2005 | Takeuchi | |

FOREIGN PATENT DOCUMENTS

| | | | |
|---|---|---|---|
| JP | 2000-149552 A | | 5/2000 |
| JP | 2002-100974 A | | 4/2002 |
| JP | 2002-152025 A | | 5/2002 |
| JP | 2004-080772 A | | 3/2004 |
| JP | 2005-353186 A | | 12/2005 |
| JP | 2008-048298 A | | 2/2008 |

* cited by examiner

*Primary Examiner* — Quan Tra
(74) *Attorney, Agent, or Firm* — Arent Fox LLP

(57) ABSTRACT

A semiconductor device provided which includes: an external power supply detection circuit which detects that an external power supply is turned on and outputs a first detection signal; an internal power supply voltage generation circuit which generates an internal power supply voltage based on the external power supply; a reference voltage generation circuit which generates a first reference voltage in response to the first detection signal; a reference voltage detection circuit which detects that the first reference voltage reaches a given level and outputs a second detection signal; a bias voltage generation circuit which, in response to the second detection signal, generates a bias voltage based on a second reference voltage dependent on the first reference voltage; and a power supply voltage detection circuit which, in response to the second detection signal, compares the bias voltage with a third reference voltage and outputs a start signal.

20 Claims, 25 Drawing Sheets

SEMICONDUCTOR START CONTROL DEVICE, METHOD, AND SYSTEM

CROSS-REFERENCE TO RELATED APPLICATIONS

This application claims the benefit of priority from Japanese Patent Application No. 2008-333268 filed on Dec. 26, 2008, the entire contents of which are incorporated herein by reference.

BACKGROUND

1. Field

The aspects discussed herein relate to a semiconductor device.

2. Description of Related Art

In a semiconductor integrated circuit, voltages used in the circuit are generated based on an external power supply voltage.

Related techniques are disclosed in Japanese Laid-open Patent Publication No. 2004-80772, Japanese Laid-open Patent Publication No. 2008-48298, Japanese Laid-open Patent Publication No. 2002-100974, Japanese Laid-open Patent Publication No. 2000-149552, Japanese Laid-open Patent Publication No. 2002-152025, and Japanese Laid-open Patent Publication No. 2005-353186.

SUMMARY

According to one aspect, a semiconductor device is provided which includes: an external power supply detection circuit configured to detect that an external power supply is turned on and configured to output a first detection signal; an internal power supply voltage generation circuit configured to generate an internal power supply voltage based on the external power supply; a reference voltage generation circuit configured to generate a first reference voltage in response to the first detection signal; a reference voltage detection circuit configured to detect that the first reference voltage reaches a given level and configured to output a second detection signal; a bias voltage generation circuit configured to generate, in response to the second detection signal, a bias voltage to which a capacitive element is coupled as a load, based on a second reference voltage dependent on the first reference voltage; and a power supply voltage detection circuit configured to compare, in response to the second detection signal, the bias voltage with a third reference voltage dependent on one of an external power supply voltage and the internal power supply voltage, and configured to output a start signal.

Additional advantages and novel features of the invention will be set forth in part in the description that follows, and in part will become more apparent to those skilled in the art upon examination of the following or upon learning by practice of the invention.

DESCRIPTION OF EMBODIMENTS

For example, in a semiconductor memory device, a reference voltage vref, step-up voltage VPP, step-down voltage VII, negative voltage VBB or the like are generated. In the semiconductor memory device, the step-up voltage VPP is used, for example, to drive word lines, the step-down voltage VII is used as a power supply voltage for memory core circuit and the like, and the negative voltage VBB is used as a board terminal voltage such as a back gate terminal voltage. These voltages are generated by an internal voltage generation circuit installed in a semiconductor integrated circuit.

Desirably, the voltages generated in the semiconductor integrated circuit are raised to given levels in a specified start-up time during start-up of the circuit. To prevent semiconductor junctions in the circuit from being forward biased and thus prevent a through current from being generated in the circuit, it is desirable that power is raised in an appropriate sequence while appropriately maintaining a magnitude relationship among the internally generated voltages.

A step-up voltage generation circuit which generates the step-up voltage VPP includes a detection circuit, oscillator circuit, pump circuit, and the like. When the detection circuit detects a drop in the step-up voltage VPP, the pump circuit is driven based on an oscillator signal generated by the oscillator circuit to increase the step-up voltage. In the detection circuit of the step-up voltage generation circuit, a differential amplifier compares the step-up voltage VPP with reference voltage vref and thereby detects a drop in the step-up voltage VPP. A bias voltage may be applied to the differential amplifier to adjust a bias current of the differential amplifier. A capacitive element for voltage stabilization may be provided to stabilize the bias voltage. The bias voltage is generated by a reference voltage generation circuit. Operation of the reference voltage generation circuit may become unstable under the influence of the capacitive element. Thus, it is desirable that the operation of the reference voltage generation circuit is not affected by capacitive elements of voltage generation circuits, such as the step-up voltage generation circuit.

During power-up, a start signal, which indicates an end of a power-up sequence and a start of operation of an internal circuit, is output with a given timing. If the start signal is output before a power supply voltage reaches a given voltage value, the internal circuit may malfunction. Thus, desirably the start signal is generated after the power supply voltage reaches the given voltage value.

Figure 1:
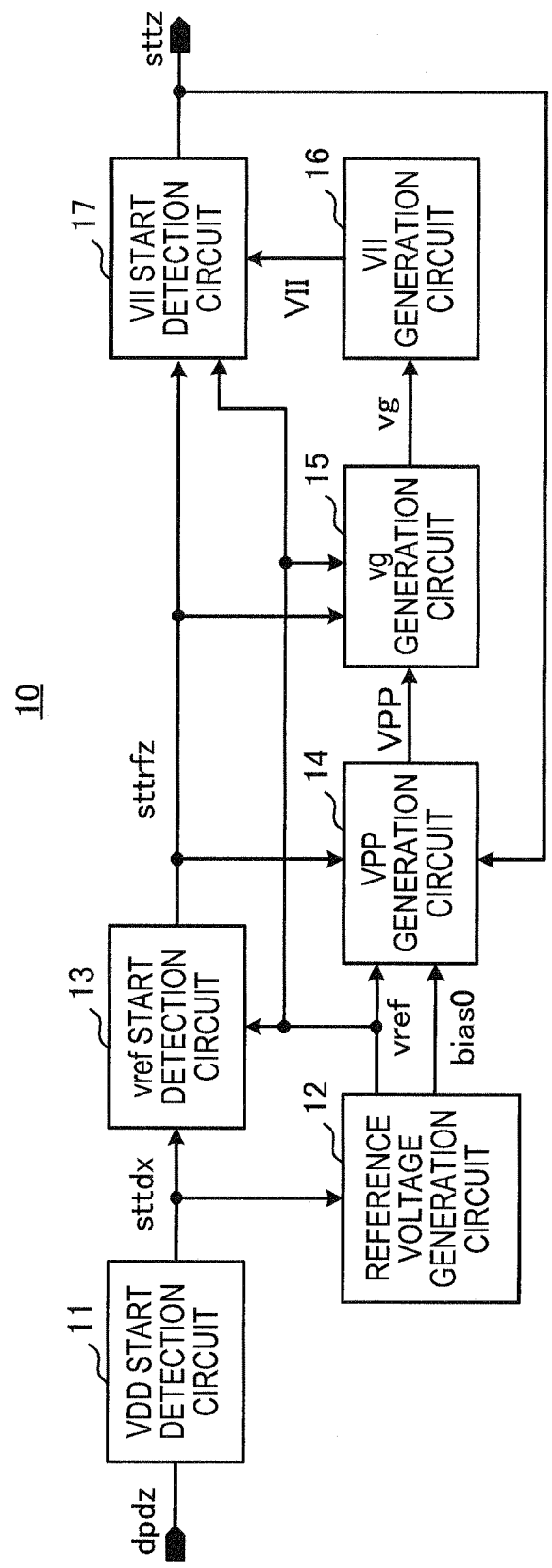
FIG. 1 is illustrates an exemplary power supply circuit.

FIG. 1 illustrates an exemplary power supply circuit. The power supply circuit illustrated in FIG. 1 may include an internal voltage generation circuit and power-up control circuit. The power supply circuit 10 includes a VDD start detection circuit 11, a reference voltage generation circuit 12, a vref start detection circuit 13, a VPP generation circuit 14, a vg generation circuit 15, a VII generation circuit 16, and a VII start detection circuit 17. The VDD start detection circuit 11 detects that a power supply voltage VDD, supplied externally, has reached or exceeded a given level and inverts a power supply voltage detection signal sttdx from a low level to a high level. Upon inversion of the power supply voltage detection signal sttdx, the reference voltage generation circuit 12 comes into operation and a reference voltage vref increases. The vref start detection circuit 13 detects that the reference voltage vref has reached or exceeded a given level and inverts a reference voltage detection signal sttrfz from a high level to a low level. Upon inversion of the reference voltage detection signal sttrfz, the VPP generation circuit 14, vg generation circuit 15, and VII start detection circuit 17 come into operation. When the VPP generation circuit 14 and vg generation circuit 15 start to operate, the step-up voltage VPP and gate voltage vg are increased. When the gate voltage vg increases, the step-down voltage VII generated by the VII generation circuit 16 increases. The VII start detection circuit 17 detects that the step-down voltage VII has reached or exceeded the reference voltage vref and inverts a start signal sttz from a high level to a low level. In a power-up sequence, to reduce the start-up time, power supply capacity for the step-up voltage VPP of the VPP generation circuit 14 may be large while the start signal sttz is in a HIGH state. As such, time of the power-up sequence may be reduced.

Upon entry into Deep Power-down mode, when a control signal dpdz becomes a high level, sttdx becomes a low level. Further, the reference voltage detection signal sttrfz and start signal sttz become a high level. In the Deep Power-down mode, internal voltage generation circuits stop. Upon exit from the Deep Power-down mode, when the control signal dpdz becomes a low level, the power supply voltage detection signal sttdx becomes a high level. The power supply circuit may be started in substantially the same manner as during the power-up described above.

Figure 2:
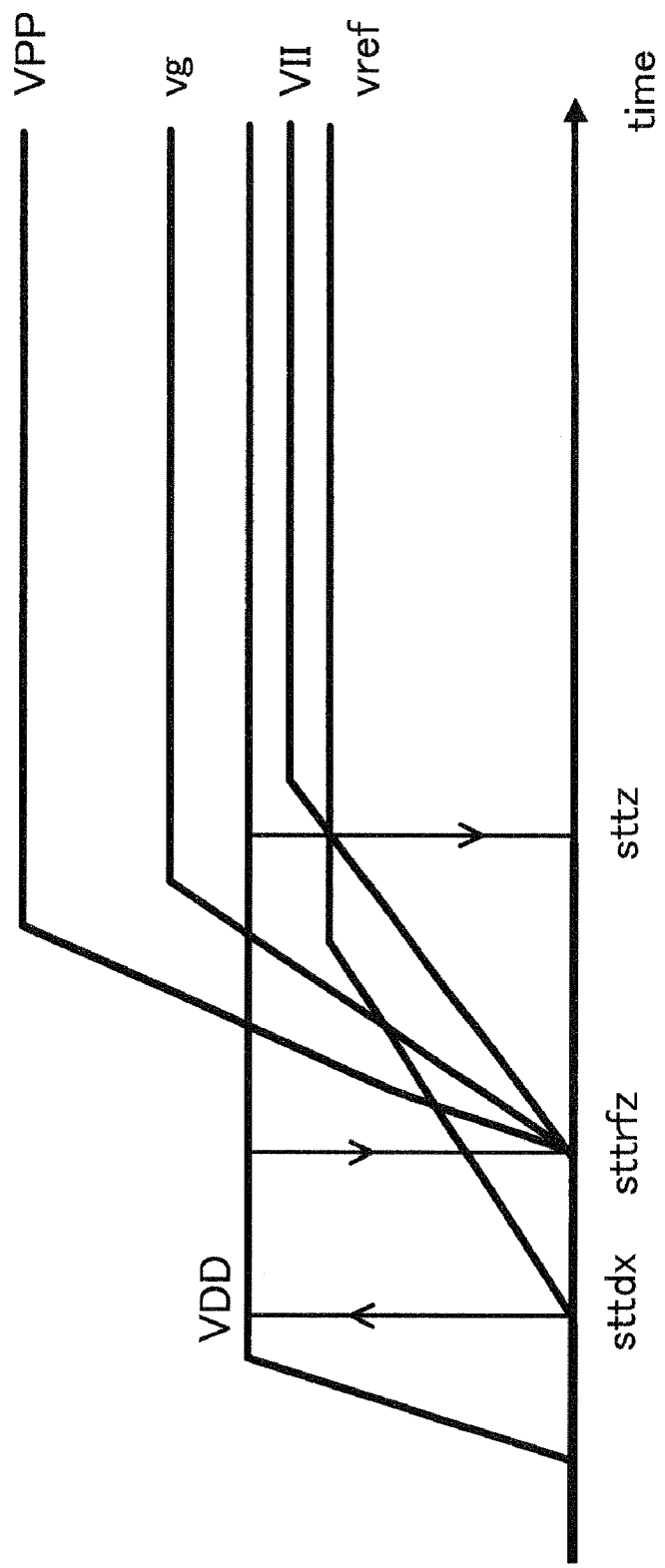
FIG. 2 illustrates exemplary changes in voltages and detection signals.

FIG. 2 illustrates exemplary changes in voltages and detection signals. The changes illustrated in FIG. 2 may be changes during the power-up sequence of the power supply circuit 10, as illustrated in FIG. 1. When the external power supply voltage VDD rises to a given level or above, the power supply voltage detection signal sttdx changes from a low level to a high level. The control signal dpdz remains a low level. When the power supply voltage detection signal sttdx changes to a high level, the reference voltage vref increases. When the reference voltage vref reaches or exceeds a given level, the reference voltage detection signal sttrfz changes from a high level to a low level (LOW). When the reference voltage detection signal sttrfz changes to a low level, the step-up voltage VPP, gate voltage vg, and step-down voltage VII are increased. When the step-down voltage VII reaches or exceeds the reference voltage vref, the start signal sttz changes from a high level to a low level.

Figure 3:
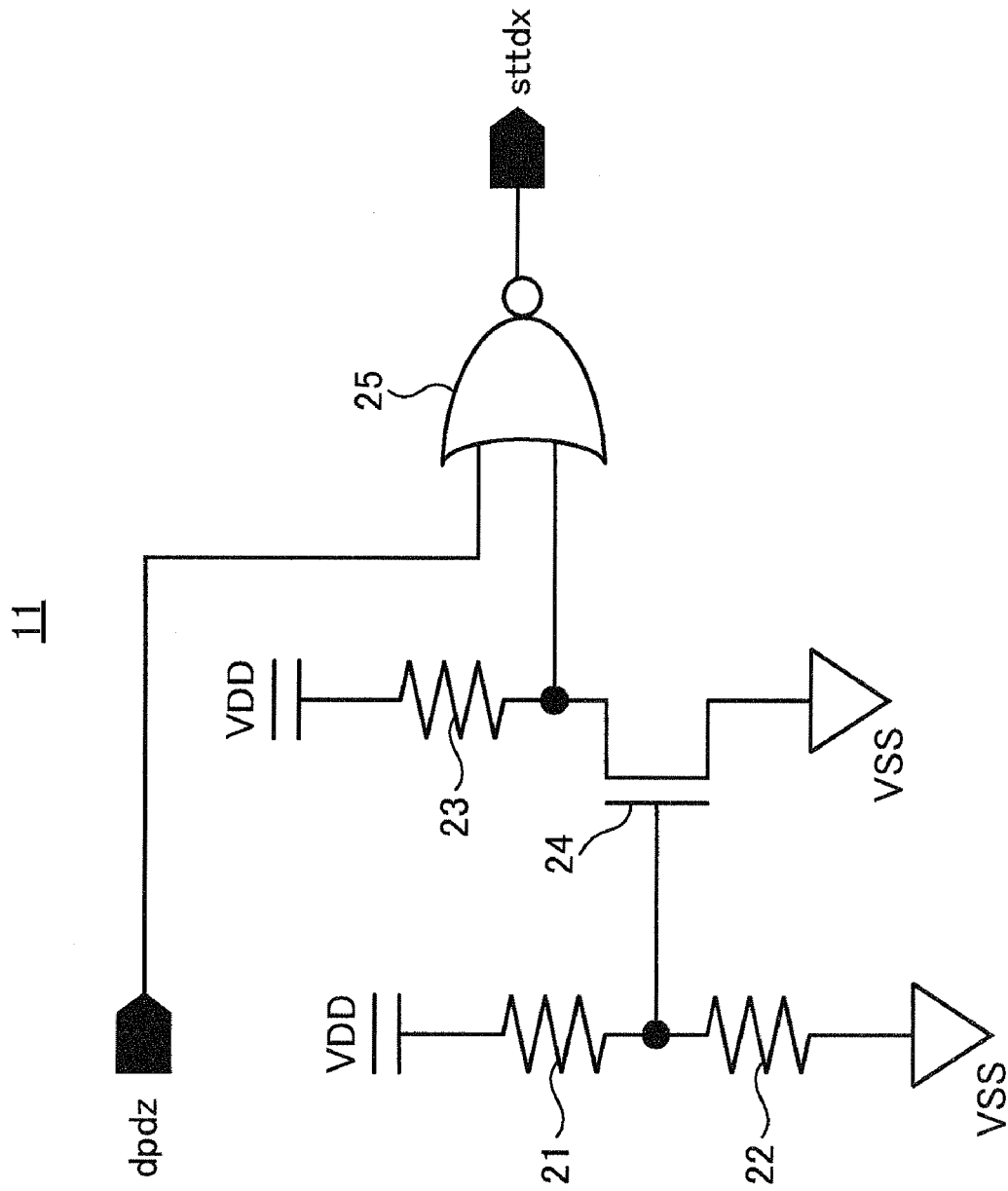
FIG. 3 illustrates an exemplary VDD start detection circuit.

FIG. 3 illustrates an exemplary VDD start detection circuit. The VDD start detection circuit illustrated in FIG. 3 may be the VDD start detection circuit 11 illustrated in FIG. 1. The VDD start detection circuit 11 includes resistive elements 21 to 23, an NMOS transistor 24, and a NOR circuit 25. The resistive elements 21 and 22 divide the power supply voltage VDD. When the power supply voltage VDD increases during start-up and a divided voltage generated by the resistive elements 21 and 22 exceeds a threshold voltage Vth of the NMOS transistor 24, the power supply voltage detection signal sttdx becomes a high level. When the control signal dpdz becomes a high level, the power supply voltage detection signal sttdx becomes a low level.

Figure 4:
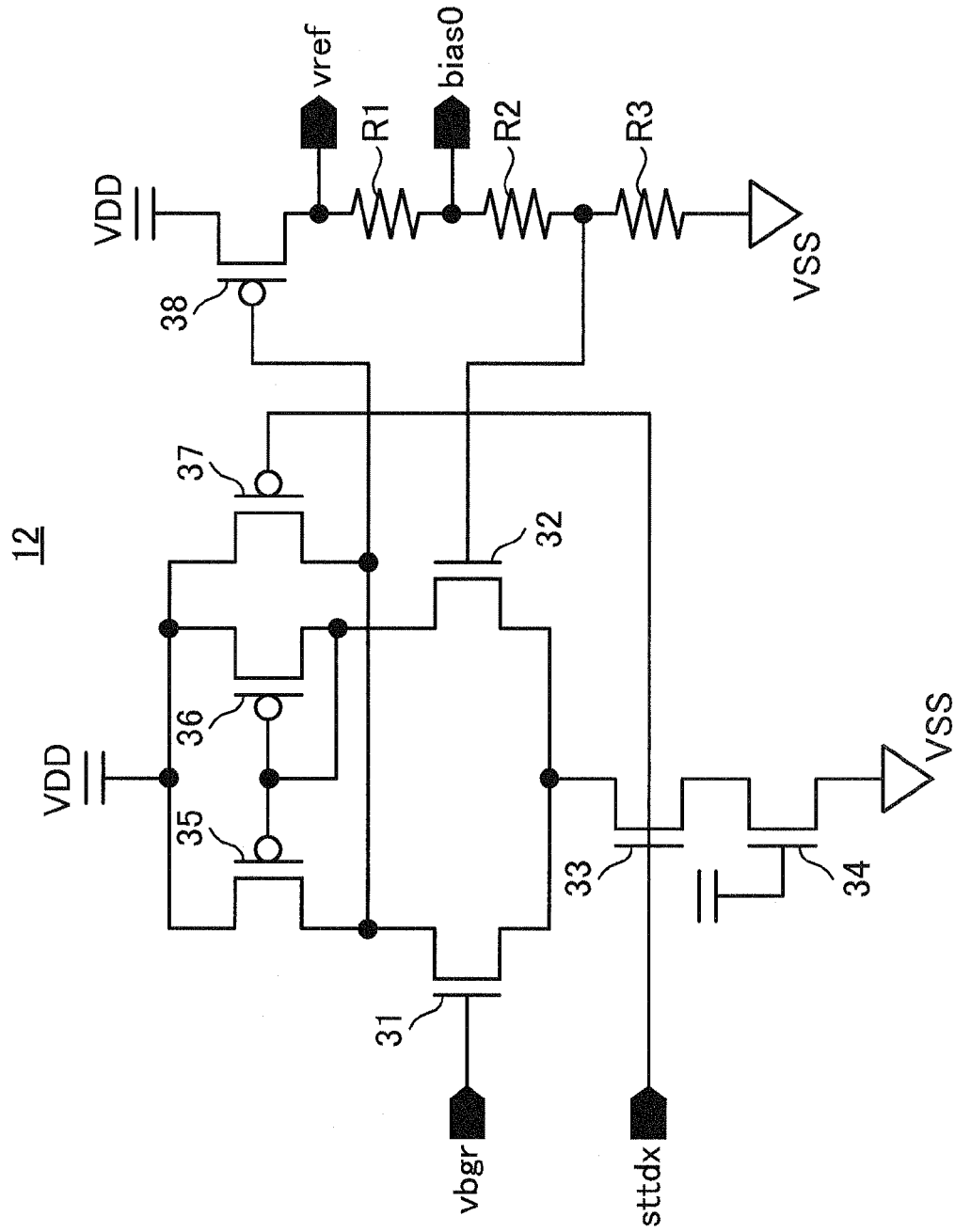
FIG. 4 illustrates an exemplary reference voltage generation circuit.

FIG. 4 illustrates an exemplary reference voltage generation circuit. The reference voltage generation circuit illustrated in FIG. 4 may be the reference voltage generation circuit 12 illustrated in FIG. 1. The reference voltage generation circuit 12 includes NMOS transistors 31 to 34, PMOS transistors 35 to 38, and resistive elements R1 to R3. The reference voltage generation circuit in FIG. 4 may include a differential amplifier circuit. When the power supply voltage detection signal sttdx becomes a high level, the differential amplifier circuit comes into operation. The differential amplifier circuit adjusts ON resistance of the PMOS transistor 38 so that a voltage obtained by dividing the power supply voltage VDD using the PMOS transistor 38 and resistive elements R1 to R3 becomes substantially equal to a band gap reference voltage vbgr. Further, a voltage at a node between the PMOS transistor 38 and resistive element R1 is obtained as the reference voltage vref. This reference voltage vref, having a given ratio to the band gap reference voltage vbgr, is generated by feedback-controlling the differential amplifier circuit via the resistive elements R1 and R2. The band gap reference voltage vbgr is generated by a band gap reference circuit (not illustrated) and is not affected by variations in temperature and the power supply voltage VDD. The band gap reference voltage vbgr may be a substantially constant voltage.

Figure 5:
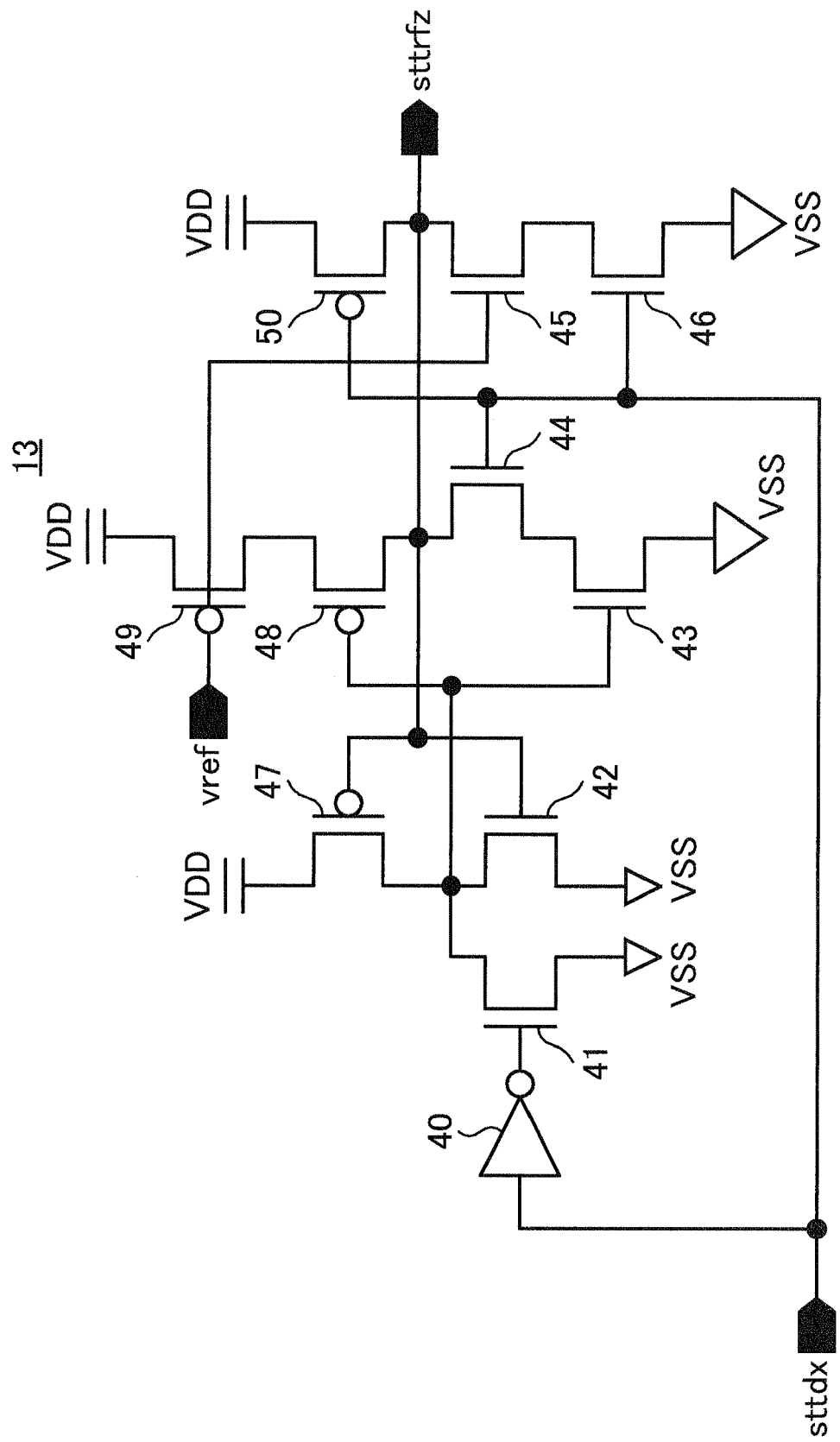
FIG. 5 illustrates an exemplary vref start detection circuit.

FIG. 5 illustrates an exemplary vref start detection circuit. The vref start detection circuit illustrated in FIG. 5 may be the vref start detection circuit 13 illustrated in FIG. 1. The vref start detection circuit 13 includes an inverter 40, NMOS transistors 41 to 46, and PMOS transistors 47 to 50. When the power supply voltage detection signal sttdx is a low level, the PMOS transistor 50 conducts and the reference voltage detection signal sttrfz may become a high level. When the power supply voltage detection signal sttdx is a high level, the PMOS transistor 50 turns off and the NMOS transistor 46 conducts. When a potential level of the reference voltage vref increases and exceeds the threshold voltage Vth of the NMOS transistor, ON resistance of the NMOS transistor 45 decreases and, for example, the NMOS transistor 45 conducts, causing potential of the reference voltage detection signal sttrfz to decrease. When the reference voltage detection signal sttrfz decreases, the PMOS transistor 47 conducts and the PMOS transistor 48 turns off. The PMOS transistors 47 and 48 and NMOS transistors 42 and 43 may include a latch. In such an aspect, when state of the latch is inverted, the reference voltage detection signal sttrfz changes rapidly from a high level to a low level.

Figure 6:
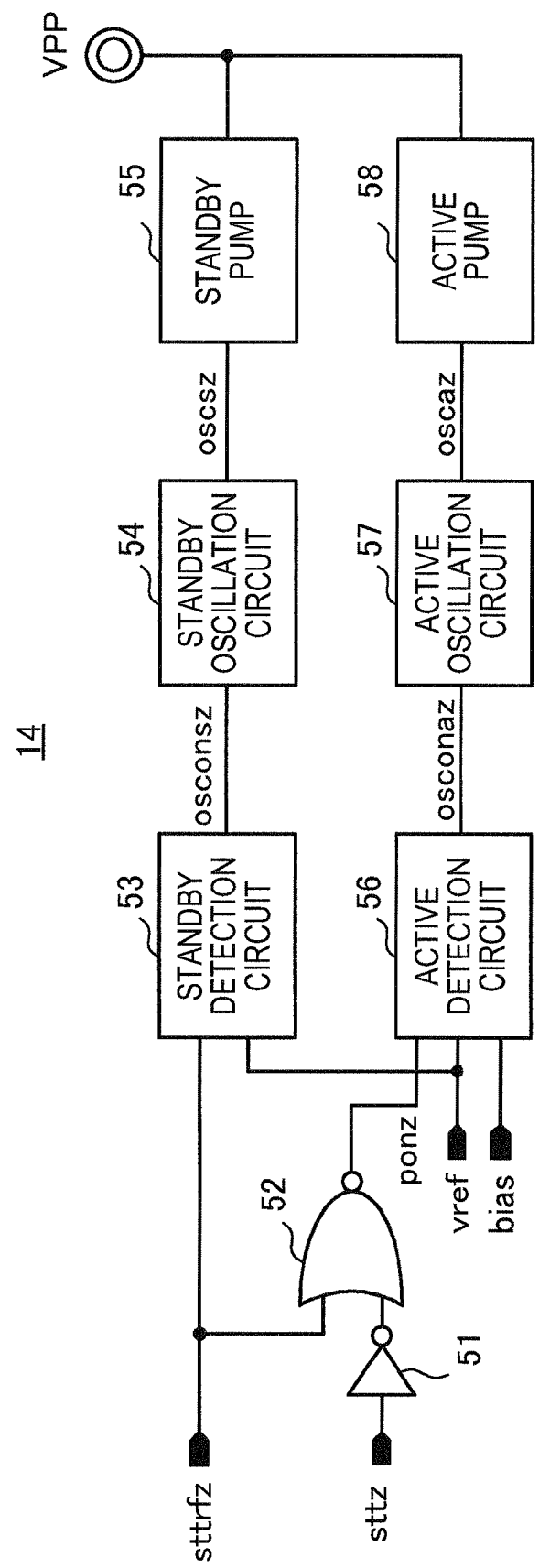
FIG. 6 illustrates an exemplary VPP generation circuit.

FIG. 6 illustrates an exemplary VPP generation circuit. The VPP generation circuit illustrated in FIG. 6 may be the VPP generation circuit 14 illustrated in FIG. 1. The VPP generation circuit 14 includes an inverter 51, NOR gate 52, a standby detection circuit 53, a standby oscillation circuit 54, a standby pump 55, a active detection circuit 56, a active oscillation circuit 57, and a active pump 58. The semiconductor integrated circuit which incorporates the power supply circuit 10 illustrated in FIG. 1 may have an active mode, in which the internal circuit is operated, and a standby mode, in which operation of the internal circuit is temporarily suspended to reduce power consumption. In normal operation state after power-up, the standby detection circuit 53 operates in the standby mode and the active mode. While in normal operation state after power-up, the active detection circuit 56 operates in the active mode.

The standby detection circuit 53 responds relatively slowly to a voltage drop of VPP. Based on a detection signal osconsz asserted by the standby detection circuit 53, the standby oscillation circuit 54 oscillates at a relatively low frequency. The standby pump 55 operates based on an oscillatory signal oscsz of the standby oscillation circuit 54 and thereby increases potential of the step-up voltage VPP at a relatively slow speed. The active detection circuit 56 responds relatively quickly to a voltage drop of VPP. Based on a detection signal osconaz asserted by the active detection circuit 56, the active oscillation circuit 57 oscillates at a relatively high frequency. The active pump 58 operates based on an oscillatory signal oscaz of the active oscillation circuit 57 and thereby increases the potential of the step-up voltage VPP at a relatively fast speed.

During start-up, the standby detection circuit 53 operates after the reference voltage detection signal sttrfz becomes a low level. At start-up, the active detection circuit 56 operates during a period in which the reference voltage detection signal sttrfz is a low level and the start signal sttz is a high level, e.g., during a period in which a signal ponz is a high level.

Figure 7:
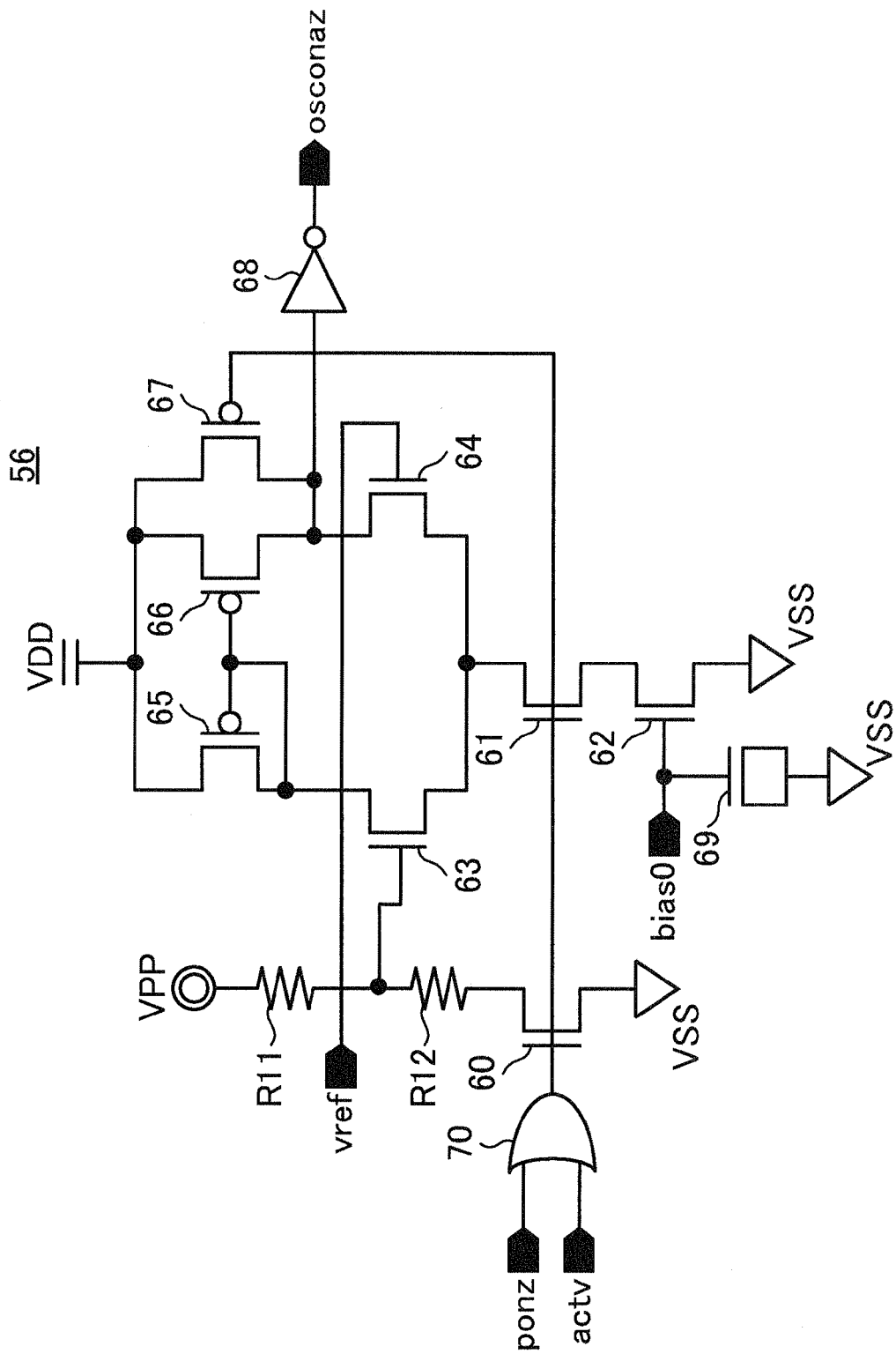
FIG. 7 illustrates an exemplary active detection circuit.

FIG. 7 illustrates an exemplary an active detection circuit. The Active detection circuit 56 includes NMOS transistors 60 to 64, PMOS transistors 65 to 67, an inverter 68, a capacitive element 69, resistive elements R11 and R12, and an OR gate 70. In normal operation after power-up, a signal actv becomes a high level in active mode. During power-up, the signal actv may remain a low level. During power-up, the active detection circuit 56 may operate when the signal ponz is a high level without operating when the signal ponz is a low level.

When the signal ponz is a high level, the NMOS transistors 61 to 64 as well as PMOS transistors 65 and 66 may operate as a differential amplifier circuit. The differential amplifier circuit compares a divided voltage generated by dividing the step-up voltage VPP by the resistive elements R11 and R12, with the reference voltage vref. When the fractional voltage of the step-up voltage VPP becomes lower than the reference voltage vref, an output signal osconaz indicating a voltage drop of the step-up voltage VPP, becomes a high level. When the output signal osconaz becomes a high level, the active oscillation circuit 57 in the next stage comes into operation.

An amount of bias current of the differential amplifier circuit is controlled by a bias voltage bias0 applied to a gate terminal of the NMOS transistor 62. The bias voltage bias0 may be generated, together with the reference voltage vref, by the reference voltage generation circuit 12 illustrated in FIG. 4. The capacitive element 69 is provided near the gate terminal of the NMOS transistor 62 to which the bias voltage bias0 is applied. The capacitive element 69 removes variations due to the noise from the bias voltage bias0 and thereby stabilizing operation of the active detection circuit 56.

The capacitive element 69 may be coupled between the resistive elements R1 and R2, where a feedback path of the reference voltage vref is provided, in the reference voltage generation circuit 12. If the capacitive element 69 is inserted in the feedback path in the reference voltage generation circuit 12, phase margin for feedback control may become insufficient, thereby making the circuit prone to oscillate.

Figure 8:
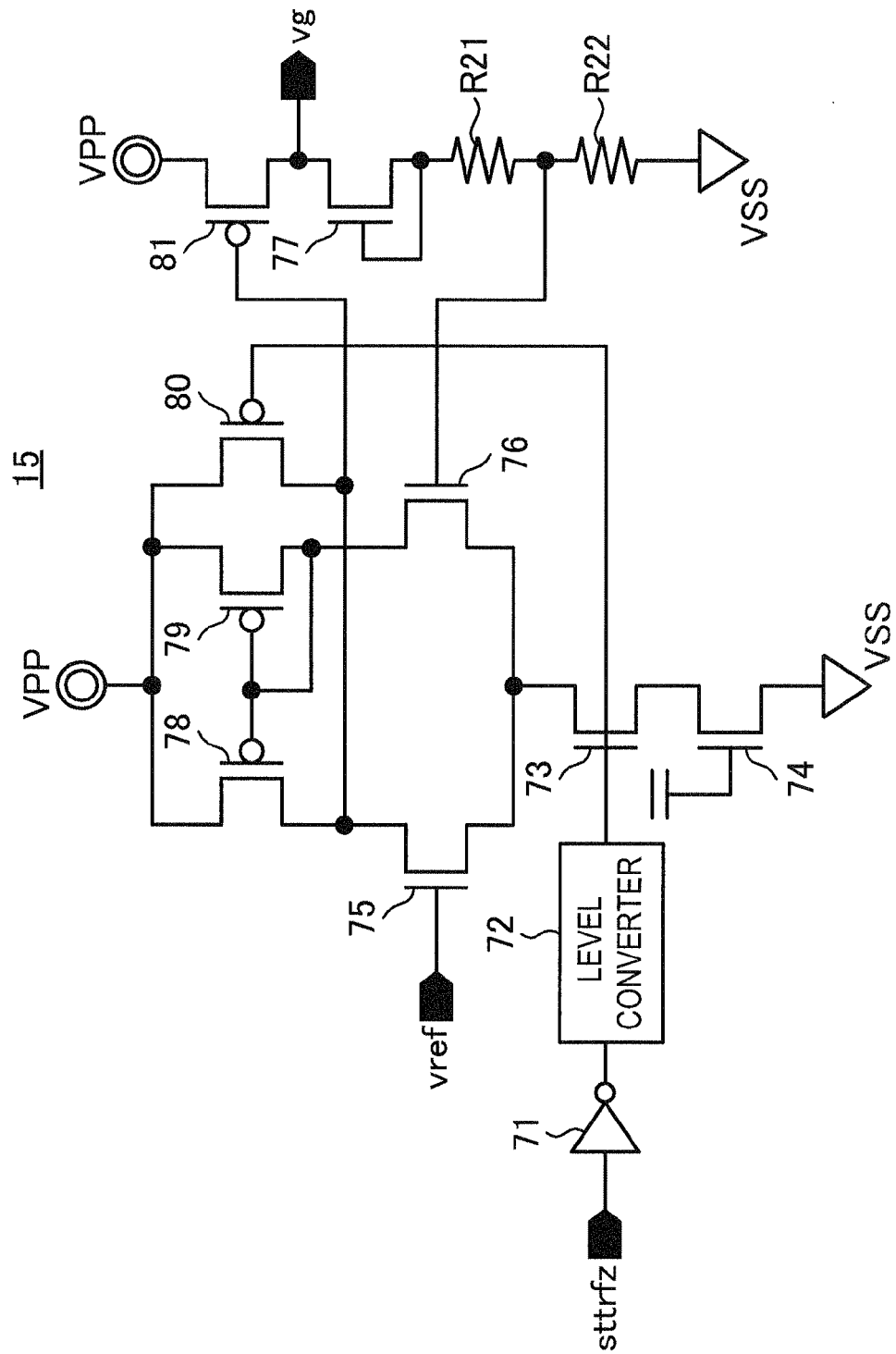
FIG. 8 illustrates an exemplary vg generation circuit.

FIG. 8 illustrates an exemplary vg generation circuit. The vg generation circuit illustrated in FIG. 8 may be the vg generation circuit 15 illustrated in FIG. 1. The vg generation circuit 15 includes an inverter 71, a level converter 72, NMOS transistors 73 to 77, PMOS transistors 78 to 81, and resistive elements R21 and R22. The vg generation circuit 15 operates when the reference voltage detection signal sttrfz is at a low level and stops when the reference voltage detection signal sttrfz becomes a high level. The level converter 72 converts the reference voltage detection signal sttrfz from a signal with an amplitude between a ground potential VSS and the power supply voltage VDD into a signal with an amplitude between the ground potential VSS and the step-up voltage VPP.

The NMOS transistors 73 to 76 as well as PMOS transistors 78 and 79 may include a differential amplifier circuit. The differential amplifier circuit comes into operation when the reference voltage detection signal sttrfz becomes a low level. The differential amplifier circuit adjusts ON resistance of the PMOS transistor 81 so that a voltage obtained by dividing the step-up voltage VPP, using the PMOS transistor 81, NMOS transistor 77, resistive element R21, and resistive element R22, becomes substantially equal to the reference voltage vref. A voltage at a node between the PMOS transistor 81 and NMOS transistor 77 is obtained as the gate voltage vg. Through feedback control, a voltage is generated as the gate voltage Vg which is obtained by adding the threshold voltage Vth of the NMOS transistor to a potential having a given ratio to the reference voltage vref.

Figure 9:
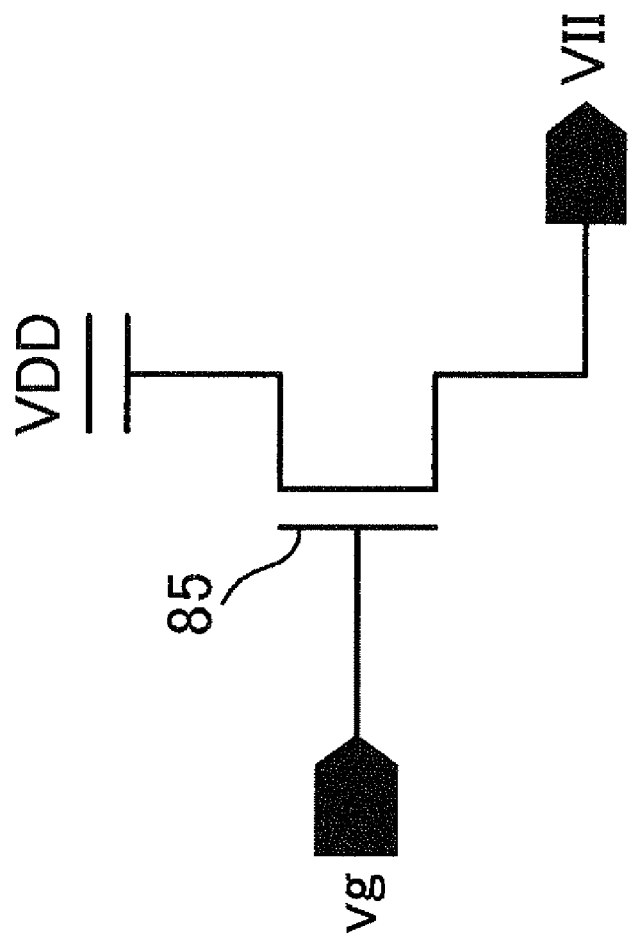
FIG. 9 illustrates an exemplary VII generation circuit.

FIG. 9 illustrates an exemplary VII generation circuit. The VII generation circuit illustrated in FIG. 9 may be the VII generation circuit 16 illustrated in FIG. 1. The VII generation circuit 16 includes an NMOS transistor 85. The gate voltage vg generated by the vg generation circuit 15 is applied to a gate terminal of the NMOS transistor 85. The power supply voltage VDD applied to a drain terminal of the NMOS transistor 85 is stepped down, and the step-down voltage VII lower than the gate voltage vg, by the threshold voltage Vth of the NMOS transistor, is generated at a source terminal of the NMOS transistor 85.

Figure 10:
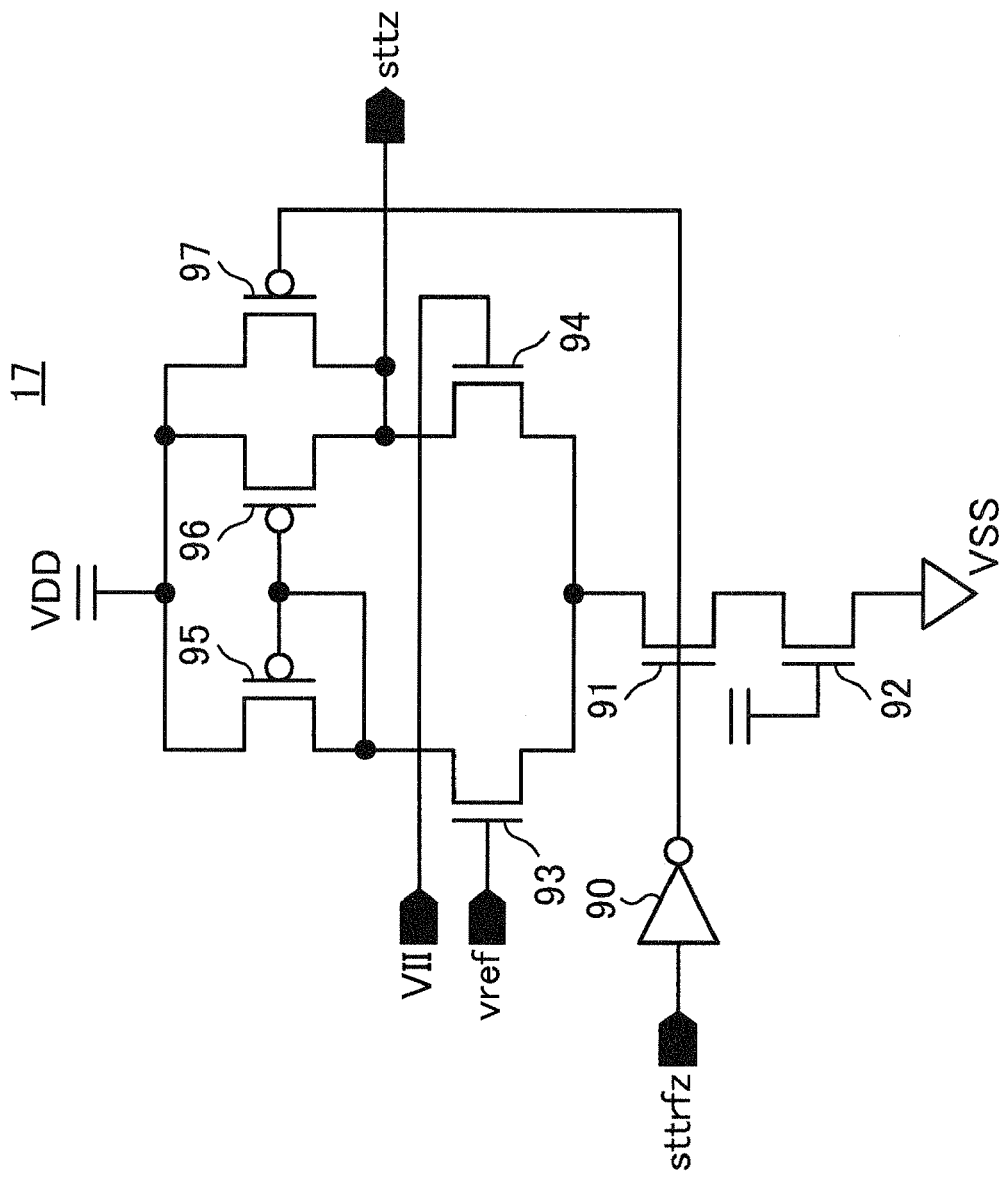
FIG. 10 illustrates an exemplary VII start detection circuit.

FIG. 10 illustrates an exemplary VII start detection circuit. The VII start detection circuit illustrated in FIG. 10 may be the VII start detection circuit 17 illustrated in FIG. 1. The VII start detection circuit 17 includes an inverter 90, NMOS transistors 91 to 94, and PMOS transistors 95 to 97. The NMOS transistors 92 to 94 as well as PMOS transistors 95 and 96 may include a differential amplifier circuit. The differential amplifier circuit comes into operation when the reference voltage detection signal sttrfz becomes a low level. The differential amplifier circuit compares the step-down voltage VII with the reference voltage vref, and changes the start signal sttz from a high level to a low level when the step-down voltage VII becomes higher than the reference voltage vref.

The power supply circuit 10 illustrated in FIG. 1 outputs internal voltages and detection signals according to the power-up sequence illustrated in FIG. 2. In the active detection circuit 56 illustrated in 7, sufficient phase margin for feedback control may not be available if the capacitive element 69 is coupled to the feedback path of the reference voltage vref in the reference voltage generation circuit 12. When the voltage VII generated by the VII generation circuit 16 is the power supply voltage VDD, the power-up sequence illustrated in FIG. 2 may not operate.

Figure 11:
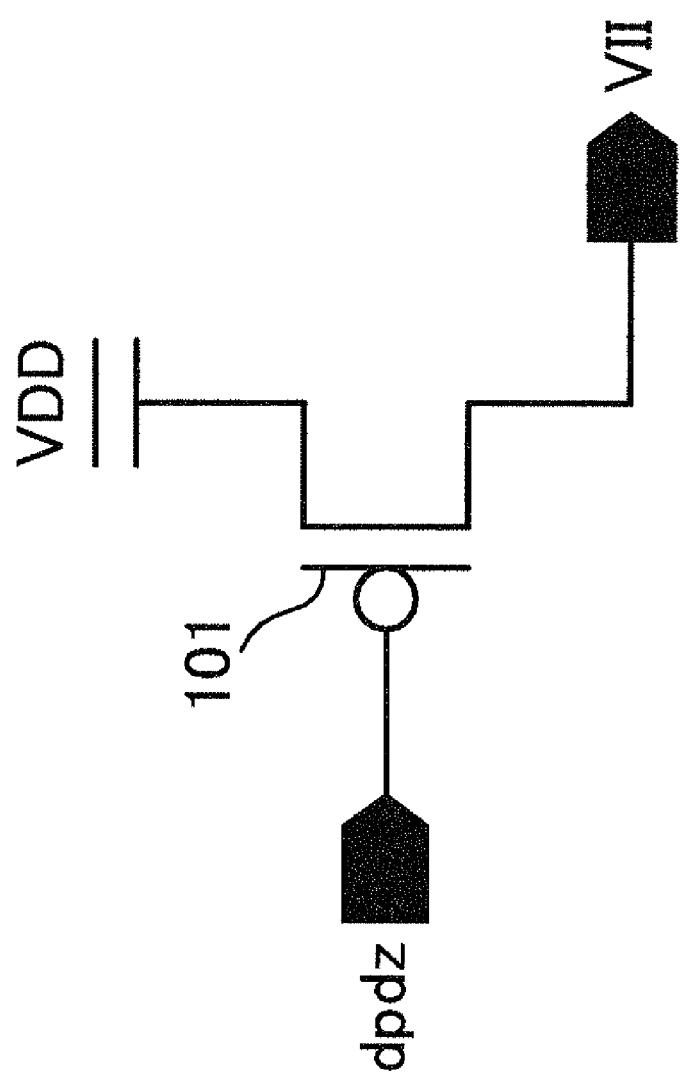
FIG. 11 illustrates an exemplary VII generation circuit.

FIG. 11 illustrates an exemplary VII generation circuit. The VII generation circuit generates an internal voltage of substantially the same potential as VDD. The VII generation circuit 116 includes a PMOS transistor 101. The control signal dpdz is applied to a gate of the PMOS transistor 101. When the control signal dpdz is a low level, an internal voltage VII, substantially the same potential as VDD, is supplied from a drain of the PMOS transistor 101 to an internal circuit. When power is not consumed in the internal circuit, as in Deep Power-down mode, the control signal dpdz is set to a high level and the internal voltage VII stops being supplied.

Figure 12:
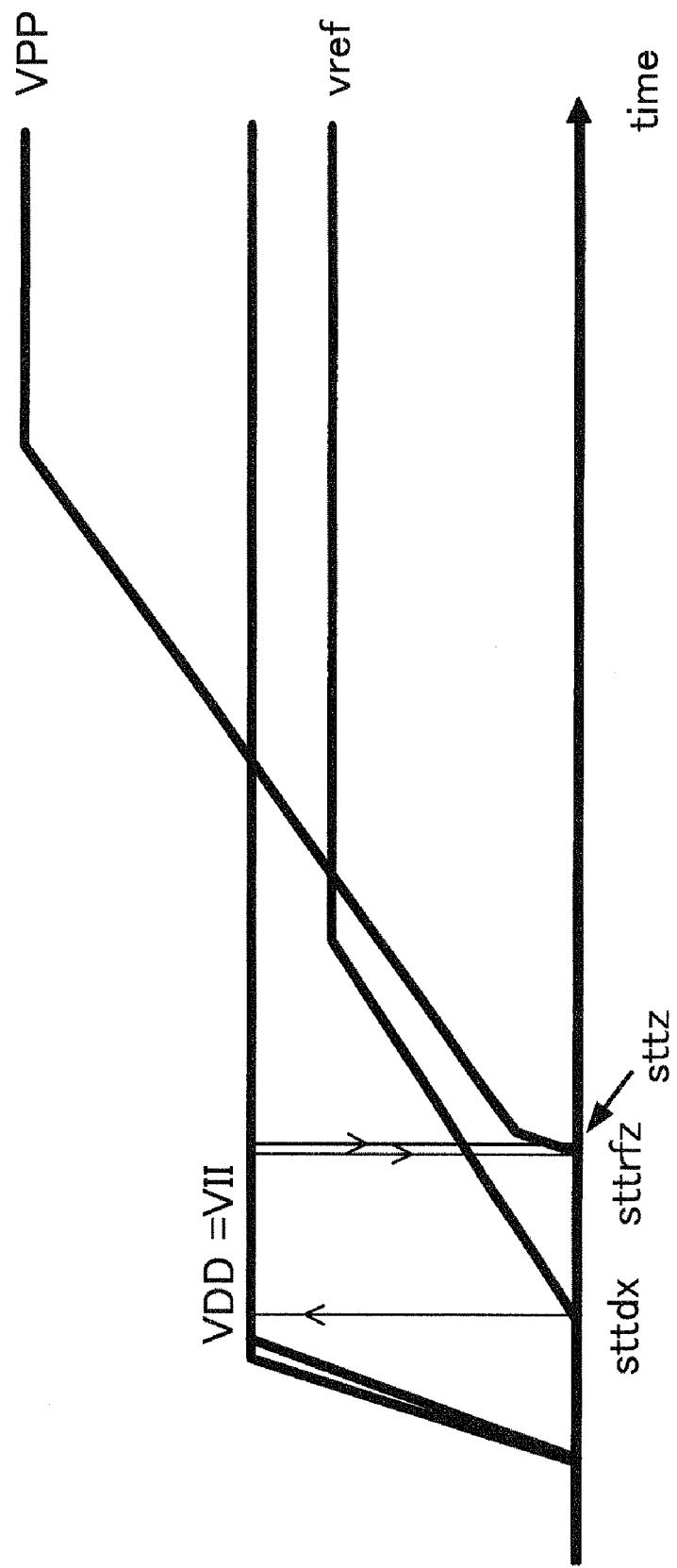
FIG. 12 illustrates an exemplary power-up sequence.

FIG. 12 illustrates an exemplary power-up sequence. The power-up sequence illustrated in FIG. 12 may be performed by the VII generation circuit illustrated in FIG. 11. When the power supply voltage VDD increases, the internal voltage VII increases, following the VDD. As with the power-up sequence illustrated in FIG. 2, the reference voltage detection signal sttrfz is inverted from a high level to a low level. When the reference voltage detection signal sttrfz becomes a low level, the VPP generation circuit 14 and VII start detection circuit 17 come into operation. Since the internal voltage VII is already higher than the reference voltage vref, the VII start detection circuit 17, such as illustrated in FIG. 10 for example, changes the start signal sttz from a high level to a low level. As illustrated in FIG. 12, the step-up voltage VPP and reference voltage vref have not reached a given level yet. If the start signal sttz becomes a low level, booster capacity of the VPP generation circuit 14 is decreased and it may take a longer time for the step-up voltage VPP to reach the given level. If the start signal sttz becomes a low level before the power supply reaches a given voltage, a latch circuit may not be initialized based on the start signal sttz.

Figure 13:
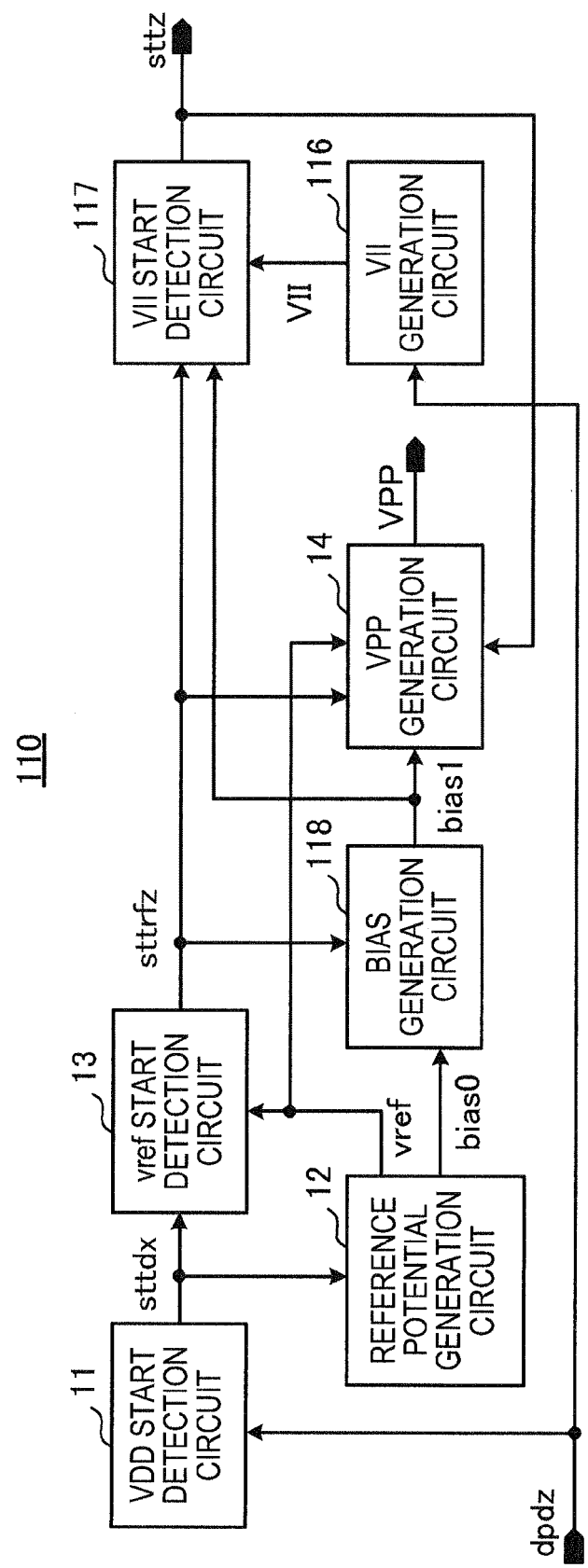
FIG. 13 illustrates an exemplary power supply circuit.

FIG. 13 illustrates an exemplary a power supply circuit. The power supply circuit includes an internal voltage generation circuit and a power-up control circuit. In FIG. 13, the same elements as those in FIGS. 1 and 11 are denoted by the same reference numerals as the corresponding elements in FIGS. 1 and 11, and description thereof will be omitted or reduced. The power supply circuit 110 illustrated in FIG. 13 includes a VII generation circuit 116 and a VII start detection circuit 117. The VII generation circuit 116 and the VII start detection circuit 117 may correspond to the VII generation circuit 16 and the VII start detection circuit 17 illustrated in FIG. 1. A bias generation circuit 118 is provided between the reference voltage generation circuit 12 and the VPP generation circuit 14. A bias voltage bias1 generated by the bias generation circuit 118 is supplied to the VPP generation circuit 14. The bias voltage bias1 may correspond to the bias voltage bias0 generated by the reference voltage generation circuit 12. For example, the bias voltage bias1 is applied to the gate terminal of the NMOS transistor 62 of the active detection circuit 56, as illustrated in FIG. 7.

Figure 14:
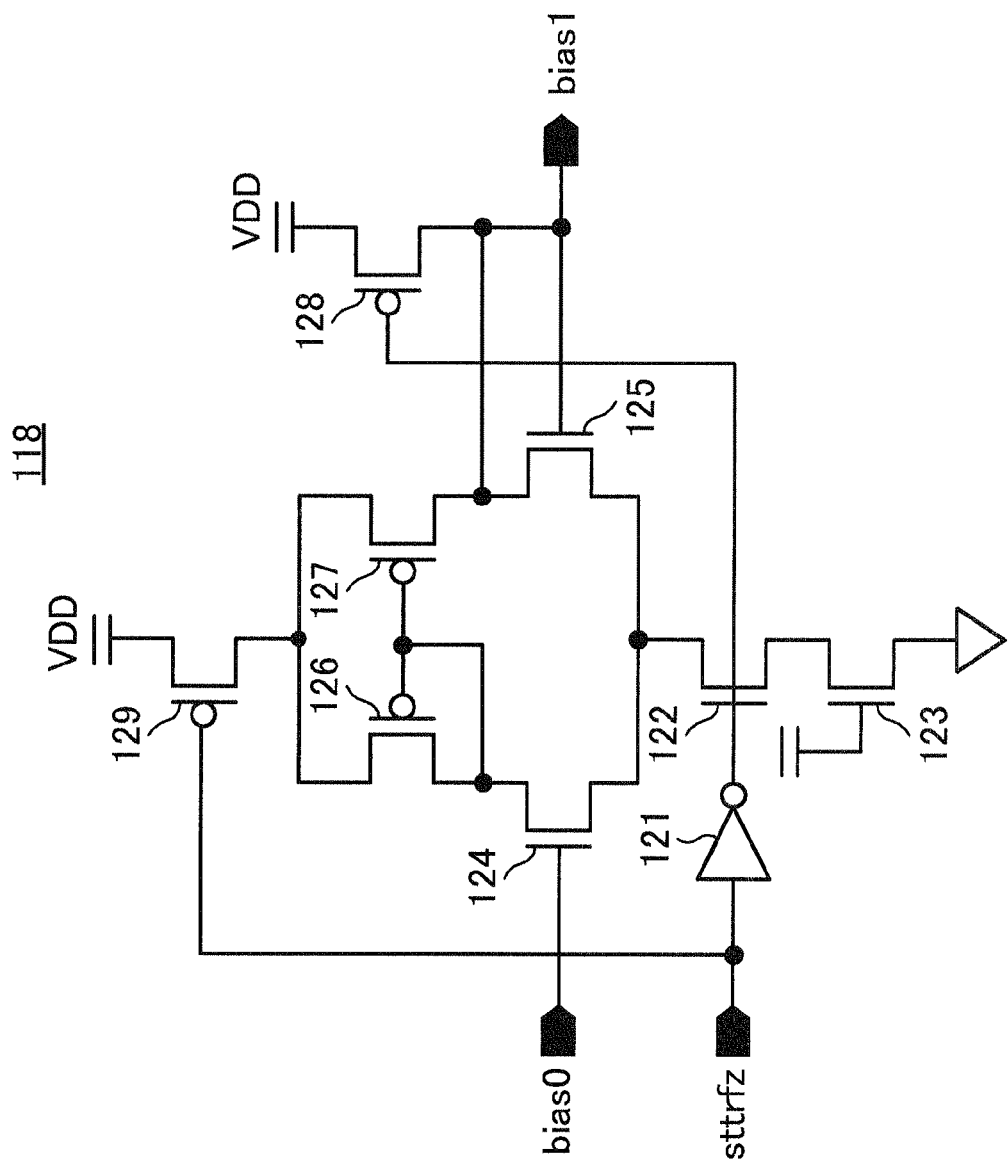
FIG. 14 illustrates an exemplary bias generation circuit 118.

FIG. 14 illustrates bias generation circuit 118. The bias generation circuit 118 includes an inverter 121, NMOS transistors 122 to 125, and PMOS transistors 126 to 129. The NMOS transistors 123 to 125 as well as PMOS transistors 126 and 127 include a differential amplifier circuit. During power-up, when the reference voltage detection signal sttrfz is a high level, the PMOS transistor 128 conducts, thereby causing the bias voltage bias1 to be clamped to the power supply voltage VDD. The NMOS transistor 122 is non-conducting, and the differential amplifier circuit does not operate.

When the reference voltage detection signal sttrfz becomes a low level, the differential amplifier circuit comes into operation. The differential amplifier circuit compares the bias voltage bias1 with the bias voltage bias0 and adjusts the bias voltage bias1 such that the two bias voltages become substantially equal. Charge stored in a capacitive element, such as the capacitive element 69 illustrated in FIG. 7, coupled to an output end of the bias voltage bias1 is drawn by a constant current flowing through the NMOS transistor 123, and the bias voltage bias1 falls from a level of VDD to a level of bias0.

The bias generation circuit 118 is coupled between the reference voltage generation circuit 12 and VPP generation circuit 14. For example, as the capacitive element 69 illustrated in FIG. 7, the capacitive element coupled to the bias voltage bias1 is separated from the bias voltage bias0. Therefore, in FIG. 13, capacity added to the feedback path of the reference voltage vref in the reference voltage generation circuit 12 is reduced, thereby securing sufficient phase margin for feedback control. The capacitive element coupled to the bias voltage bias1 resists changes in the bias voltage bias1, and thus, the bias voltage bias1 falls slowly.

Figure 15:
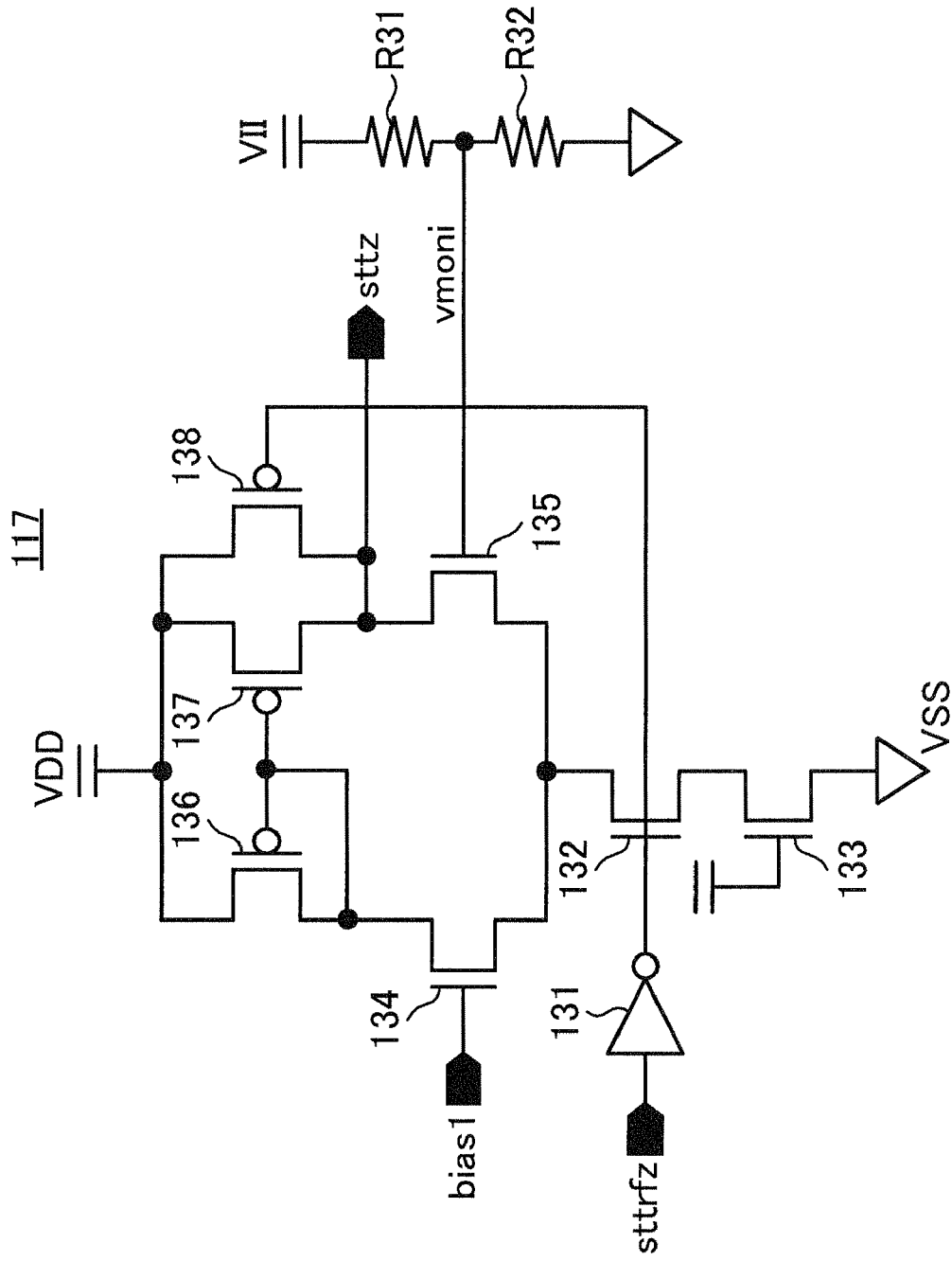
FIG. 15 illustrates an exemplary VII start detection circuit.

FIG. 15 illustrates an exemplary VII start detection circuit. The VII start detection circuit 117 includes an inverter 131, NMOS transistors 132 to 135, PMOS transistors 136 to 138, and resistive elements R31 and R32. The NMOS transistors 133 to 135 as well as PMOS transistors 136 and 137 include a differential amplifier circuit. During power-up, when the reference voltage detection signal sttrfz is a high level, the PMOS transistor 138 conducts and the power supply voltage detection signal sttz becomes a high level. When the reference voltage detection signal sttrfz becomes a low level, the PMOS transistor 138 becomes non-conductive and the differential amplifier circuit starts operation. The differential amplifier circuit compares the bias voltage bias1 with a fractional voltage vmoni, obtained by dividing the internal voltage VII by the resistive elements R31 and R32. When the bias voltage bias1 decreases below the fractional voltage vmoni, the differential amplifier circuit changes the start signal sttz from a high level to a low level.

Figure 16:
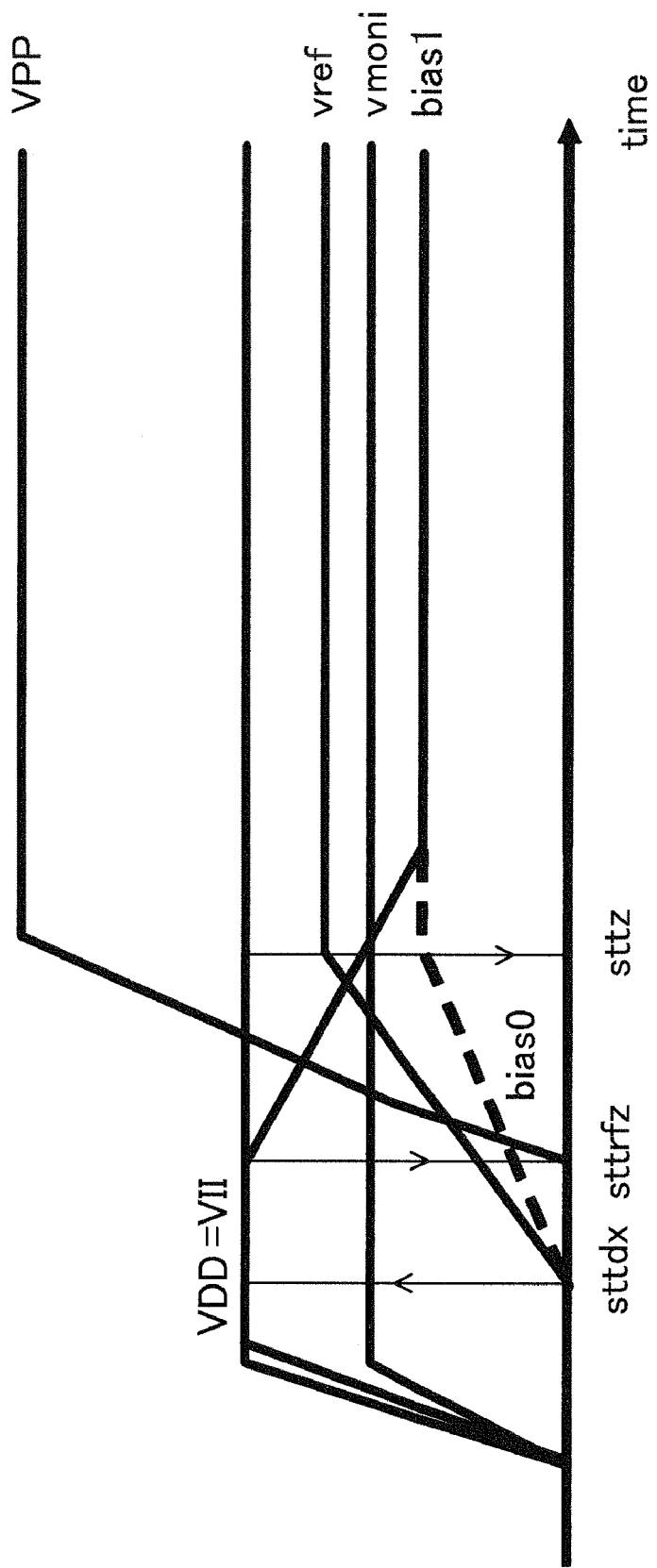
FIG. 16 illustrates exemplary changes in voltages and detection signals.

FIG. 16 illustrates exemplary changes in voltages and detection signals. The changes in the voltages and detection signals illustrated in FIG. 16 may be substantially similar to the changes in the power-up sequence of the power supply circuit 110 illustrated in FIG. 13. The internal voltage VII increases, following the increases in the external power supply voltage VDD. The divided voltage vmoni obtained by dividing the internal voltage VII increases as well. As such, when the external power supply voltage VDD reaches a given level, the internal voltage VII reaches a given level as well. The divided voltage vmoni depends on a voltage division ratio of the voltage divider circuit. When the external power supply voltage VDD reaches or exceeds the given level, the power supply voltage detection signal sttdx changes from a low level to a high level. Further, when the power supply voltage detection signal sttdx changes to a high level, the reference voltage vref increases. Therefore, a divided voltage bias0 obtained by dividing vref increases as well. When the reference voltage vref reaches or exceeds a given level, the reference voltage detection signal sttrfz changes from a high level to a low level.

When the reference voltage detection signal sttrfz changes to a low level, the step-up voltage VPP increases and the bias voltage bias1 falls from the level of VDD toward the level of bias0. The bias voltage bias1 falls gradually from the level of VDD toward the level of bias0 under the influence of the capacitive element. When the bias voltage bias1 falls below the divided voltage vmoni, the start signal sttz changes from a high level to a low level. Since the bias voltage bias1 falls gradually, the step-up voltage VPP increases to the given level to be reached, until the start signal sttz becomes a low level.

In the power supply circuit 110 illustrated in FIG. 13, the VDD start detection circuit 11 detects that the external power supply VDD has been turned on and outputs a power supply voltage detection signal sttdx. Based on the external power supply voltage VDD, the VII generation circuit 116 generates the internal voltage VII. The reference voltage generation circuit 12 generates the reference voltage vref in response to the power supply voltage detection signal sttdx. The vref start detection circuit 13 detects that the reference voltage vref has reached a given level and outputs a reference voltage detection signal sttrfz. In response to the reference voltage detection signal sttrfz, the bias generation circuit 118 generates the bias voltage bias1, to which a capacitive element is coupled as a load, based on the divided voltage bias0 obtained by dividing the reference voltage vref. In response to the reference voltage detection signal sttrfz, the VII start detection circuit 117 detects the internal voltage VII and outputs the start signal sttz, based on the bias voltage bias1 and the divided voltage vmoni obtained by dividing the internal voltage VII.

The bias voltage bias1 is separated from the divided voltage bias0 obtained by dividing the reference voltage vref. Since the bias voltage bias1 and divided voltage bias0 are separate signals, a load applied to the bias voltage bias1 may not be applied to the divided voltage bias0. As such, stable reference voltage is generated without being affected by the capacitance coupled to the bias voltage bias1. Changes in the bias voltage bias1 become slow due to the capacitive element coupled to the bias voltage bias1, and it takes a longer time to detect the internal voltage VII and output the start signal sttz. High current-supplying capacity of the step-up circuit is maintained. Therefore, the step-up voltage increases to a desired level in a short time, and before the start signal sttz is output, various power supply voltages are set to desired levels.

Figure 24:
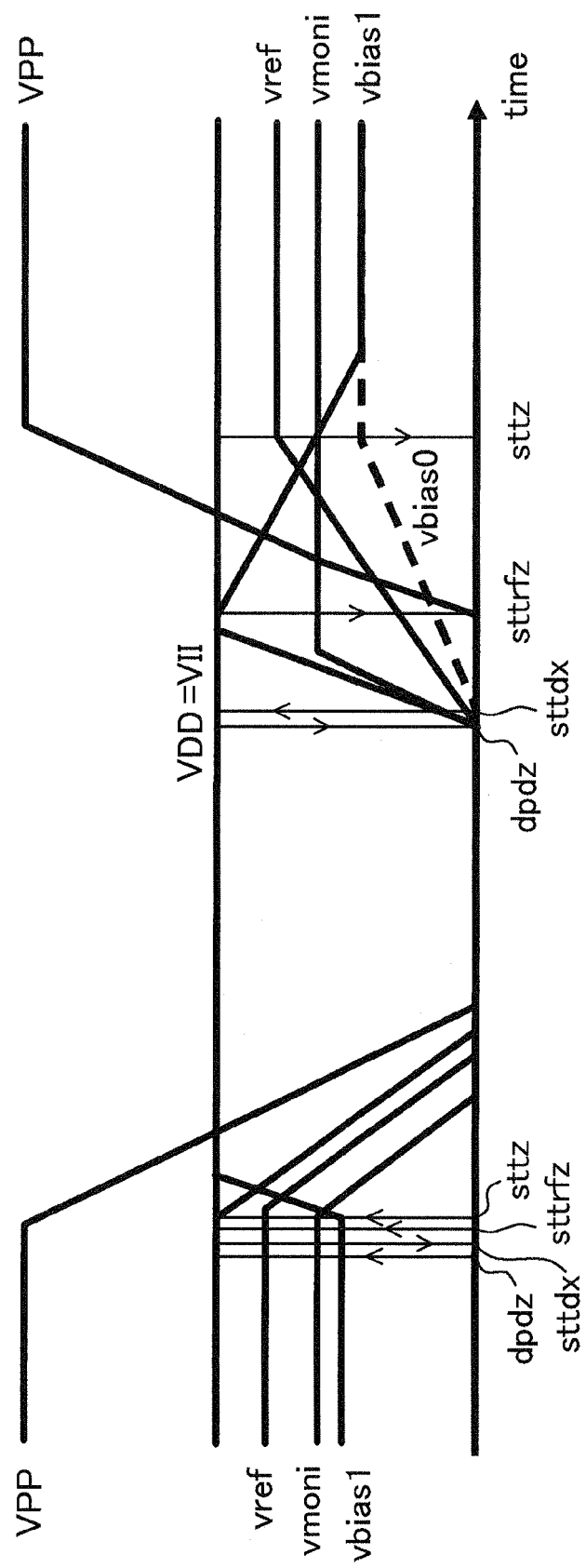
FIG. 24 illustrates exemplary changes in voltages and detection signals.

FIG. 24 illustrates exemplary changes in generated voltages and detection signals. The changes in the generated voltages and detection signals illustrated in FIG. 24 may be changes in an entry sequence, to enter the deep power-down mode, and an exit sequence, to exit from the deep power-down mode, which are used in the power supply circuit 110 illustrated in FIG. 13. Upon entry into the deep power-down mode, when the control signal dpdz becomes a high level, the power supply voltage detection signal sttdx becomes a low level. The reference voltage detection signal sttrfz and the start signal sttz become a high level. In the deep power-down mode, the voltage generation circuit stops. The bias voltage bias1 is clamped to the power supply voltage VDD. The other internal power supplies are reduced due to leakage current. Upon exit from the deep power-down mode, when the control signal dpdz becomes a low level, the power supply voltage detection signal sttdx becomes a high level. The power supply circuit may be started in substantially the same manner as during the power-up described above.

Figure 25:
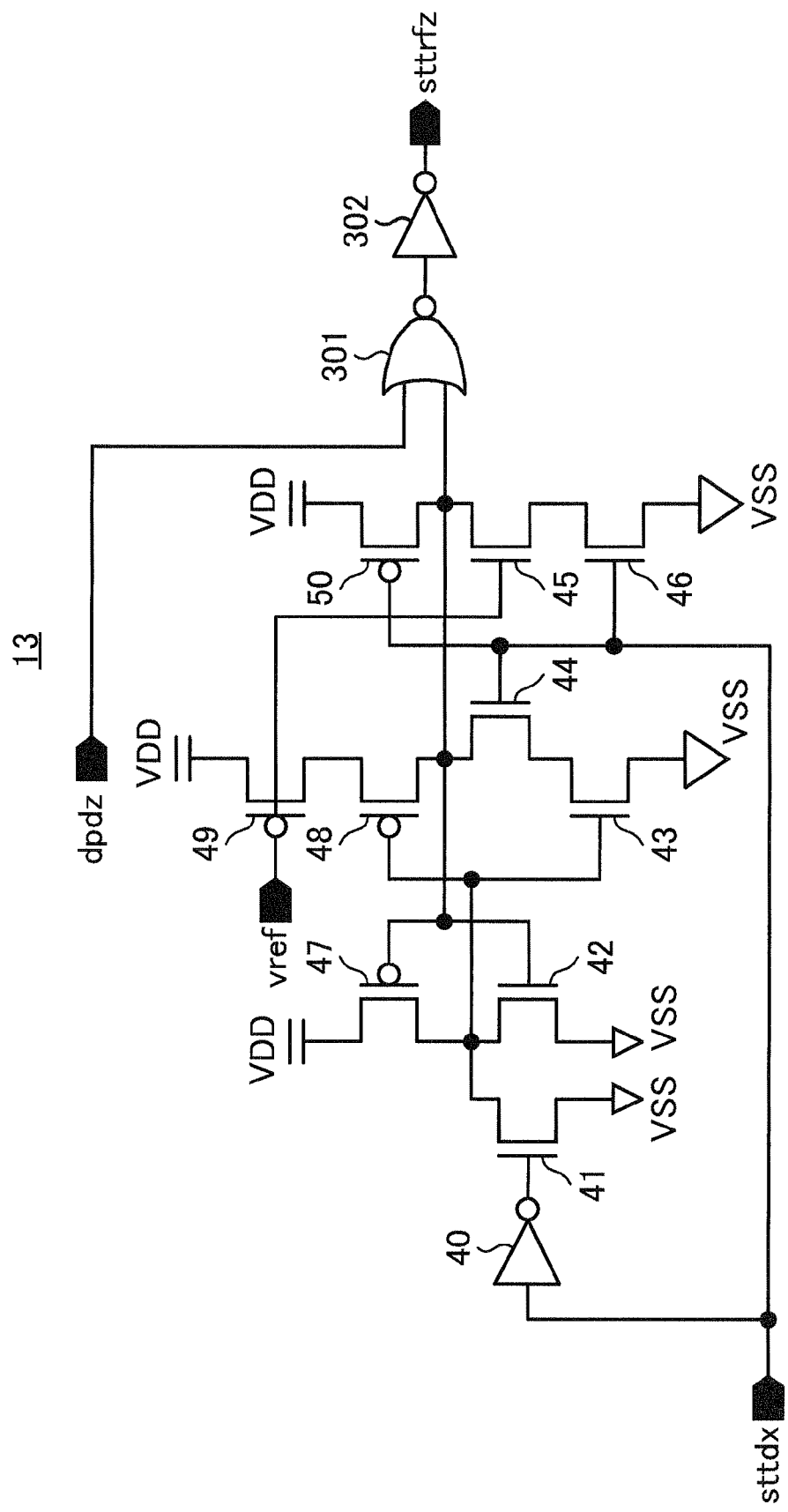
FIG. 25 illustrates an exemplary vref start detection circuit.

In the deep power-down mode, if the reference voltage generation circuit does not stop, the control signal dpdz is input to the vref start detection circuit 13. The vref start detection circuit 13 may be, for example, the vref start detection circuit illustrated in FIG. 25. The vref start detection circuit illustrated in FIG. 25 includes a NOR circuit 301 and inverter 302. Upon entry into the deep power-down mode, when the control signal dpdz becomes a high level, the power supply voltage detection signal sttdx remains a high level, and the reference voltage detection signal sttrfz becomes a high level. In the deep power-down mode, the reference voltage generation circuit 12 operates and the voltage generation circuit stops. Upon exit from the deep power-down mode, when the control signal dpdz becomes a low level, the reference voltage detection signal sttrfz becomes a low level after the reference voltage is detected. The power supply circuit may be started in substantially the same manner as during the power-up described above.

Figure 17:
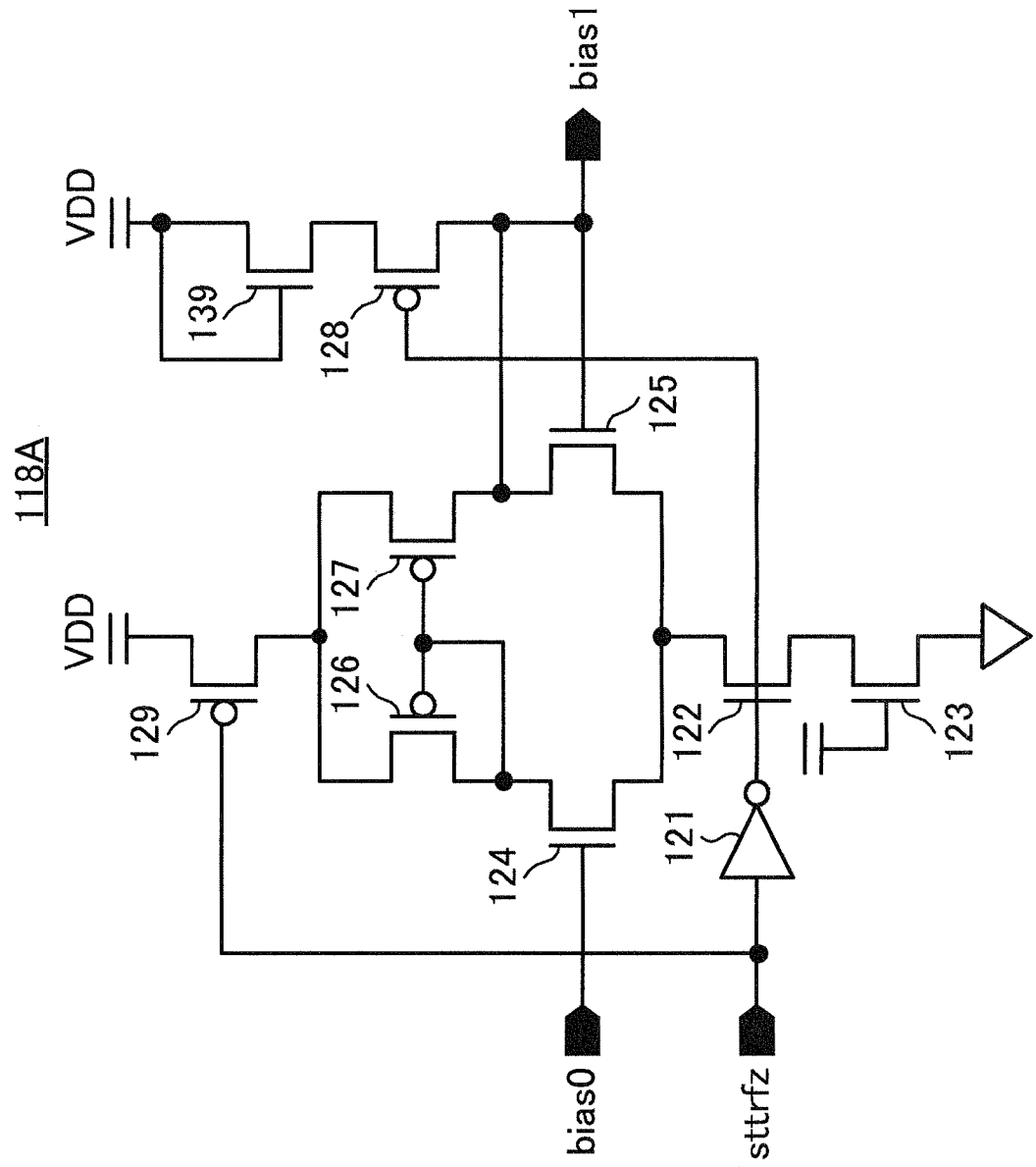
FIG. 17 illustrates an exemplary bias generation circuit.

FIG. 17 illustrates an exemplary bias generation circuit. In FIG. 17, the same elements as those in FIG. 14 are denoted by the same reference numerals as the corresponding elements in FIG. 14, and description thereof will be omitted or reduced. The bias generation circuit 118A illustrated in FIG. 17 includes a diode-coupled NMOS transistor 139. The existence of NMOS transistor 139 causes an initial value of the bias voltage bias1 to be lower than VDD by the threshold voltage Vth of the NMOS transistor. Therefore, the bias voltage bias1 reaches bias0 in a shorter time. The interval between the time when the reference voltage detection signal sttrfz becomes a low level and the time when the start signal sttz becomes a low level is adjusted.

Figure 18:
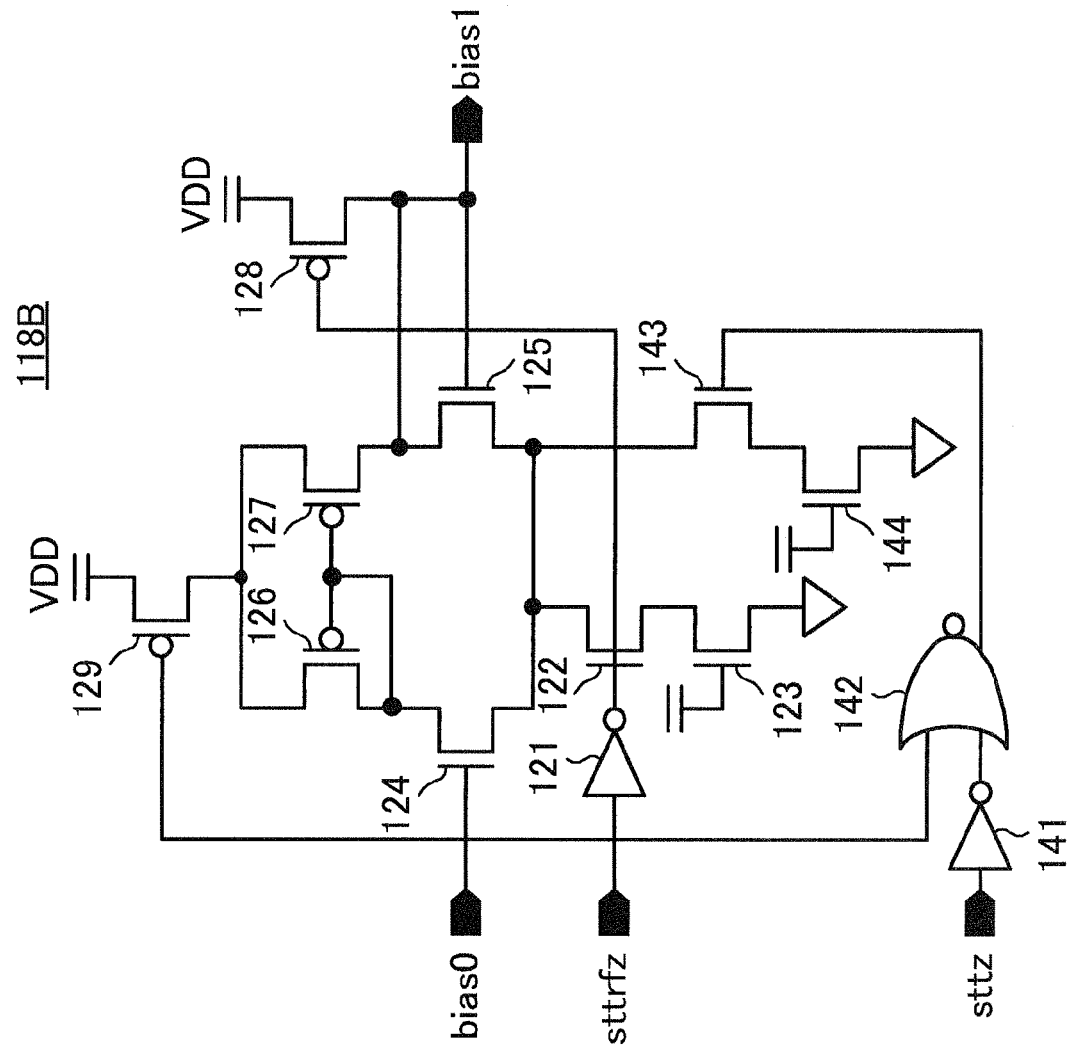
FIG. 18 illustrates an exemplary bias generation circuit.

FIG. 18 illustrates an exemplary bias generation circuit. In FIG. 18, the same elements as those in FIG. 14 are denoted by the same reference numerals as the corresponding elements in FIG. 14, and description thereof will be omitted or reduced. The bias generation circuit 118B illustrated in FIG. 18 includes an inverter 141, NOR gate 142, NMOS transistor 143, and NMOS transistor 144. The bias generation circuit 118B may have a configuration substantially similar to that of the bias generation circuit 118 illustrated in FIG. 14. The NMOS transistor 143 and NMOS transistor 144 are coupled in series and are inserted between a common source of the differential amplifier circuit and ground. A signal applied to a gate terminal of the NMOS transistor 143 remains a high level from the time when the reference voltage detection signal sttrfz becomes a low level to the time when the start signal sttz becomes a low level. During this period, operating current of the differential amplifier circuit increases. Current drawn from the bias voltage bias1 increases, and the time for the bias voltage bias1 to reach the voltage of bias0 is reduced. As such, the interval between the time when the reference voltage detection signal sttrfz becomes a low level and the time when the start signal sttz becomes a low level is adjusted.

Figure 19:
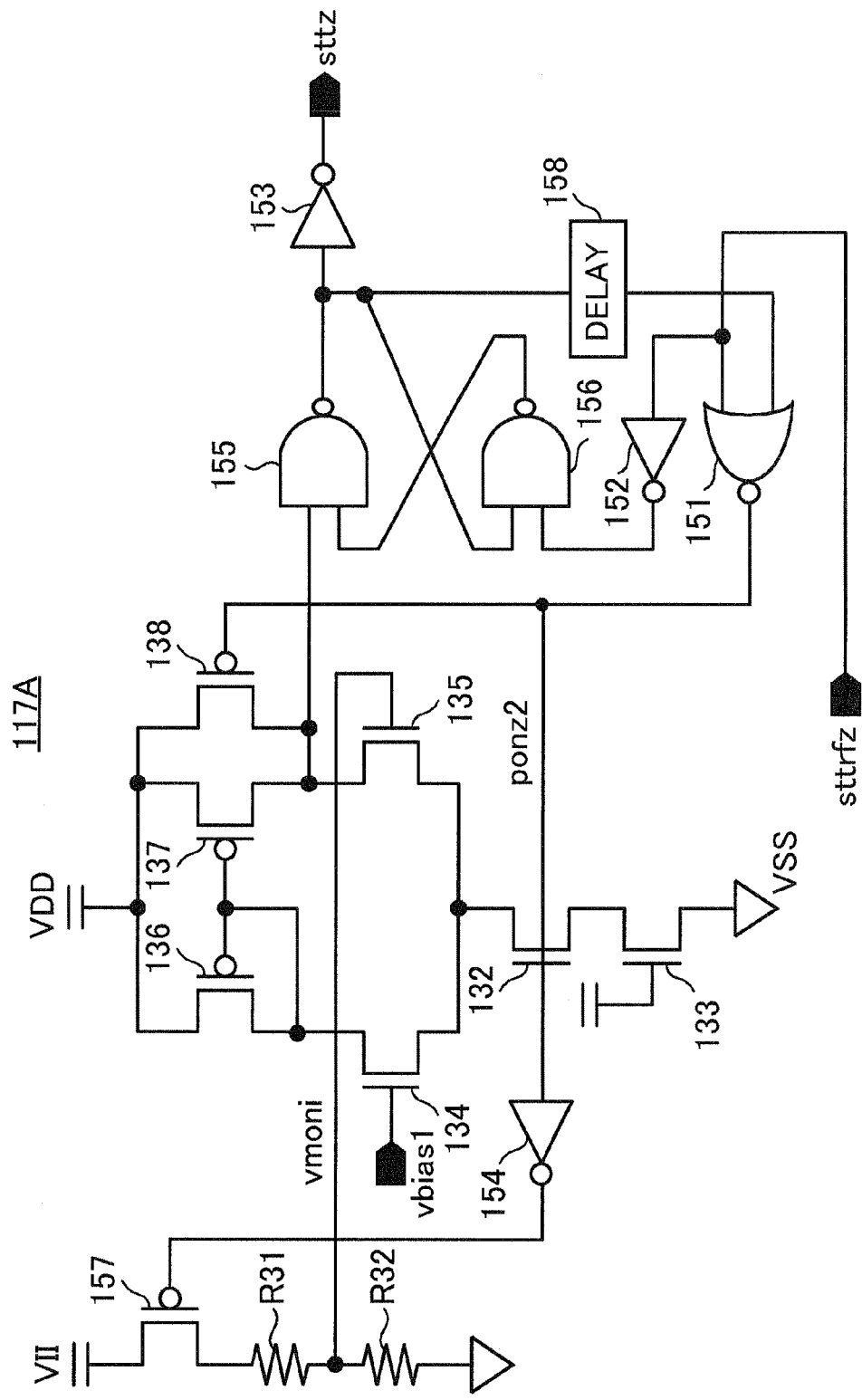
FIG. 19 illustrates an exemplary VII start detection circuit.

FIG. 19 illustrates an exemplary VII start detection circuit. In FIG. 19, the same elements as those in FIG. 15 are denoted by the same reference numerals as the corresponding elements in FIG. 15, and description thereof will be omitted or reduced. The VII start detection circuit 117A, illustrated in FIG. 19, includes a NOR gate 151, inverters 152 to 154, NAND gates 155 and 156, a PMOS transistor 157, and a delay circuit 158. The VII start detection circuit 117A may have a configuration substantially similar to that of the VII start detection circuit illustrated in FIG. 15. When the reference voltage detection signal sttrfz is a high level, a signal ponz2 is a low level, and the differential amplifier circuit and VII voltage divider circuit do not operate. During this time, inputs from the differential amplifier circuit into flip-flops of the NAND gates 155 and 156 are at a high level, and the start signal sttz is at a high level. When the reference voltage detection signal sttrfz becomes a low level, the signal ponz2 becomes a high level, and the differential amplifier circuit and VII voltage divider circuit start operation. When the divided voltage vmoni is lower than the bias voltage bias1, the outputs from the differential amplifier circuit to the flip-flops are at a high level. When the divided voltage vmoni becomes higher than the bias voltage bias1, the outputs from the differential amplifier circuit to the flip-flops become a low level. In response to the LOW outputs, outputs of the flip-flops are inverted from a low level to a high level, and the start signal sttz becomes a low level. The HIGH outputs of the flip-flops are input in the NOR gate 151 via the delay circuit 158, and the signal ponz2 becomes a low level. As such, the differential amplifier circuit and VII voltage divider circuit stop. When the power-up sequence is finished, current flowing through the circuits is limited, thereby reducing current consumption of the circuits.

Figure 20:
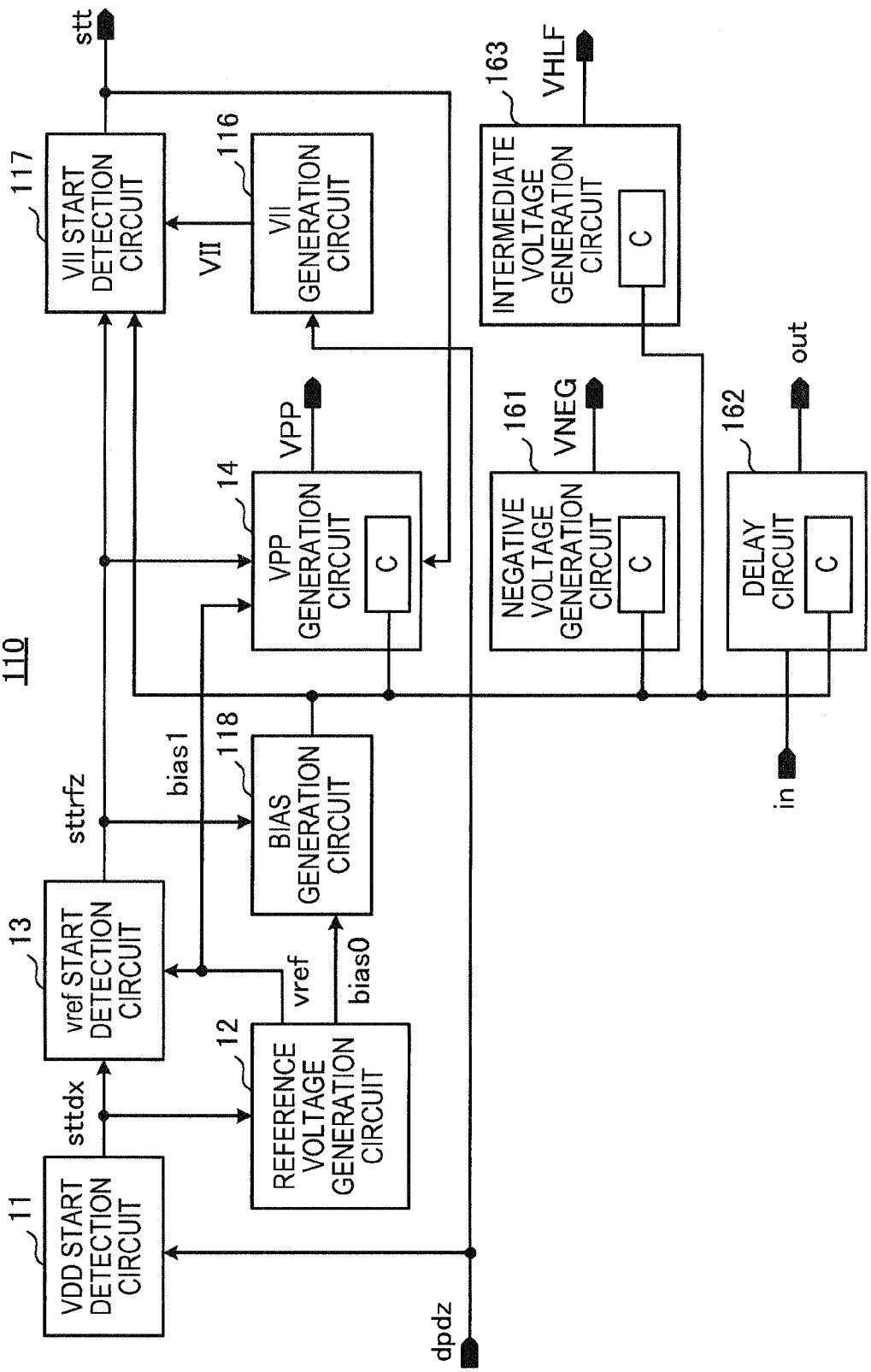
FIG. 20 illustrates an exemplary power supply circuit.

FIG. 20 illustrates an exemplary power supply circuit. In FIG. 20, the same elements as those in FIG. 13 are denoted by the same reference numerals as the corresponding elements in FIG. 13, and description thereof will be omitted or reduced. The power supply circuit 110 illustrated in FIG. 13 supplies the bias voltage bias1 to the VPP generation circuit 14, and the bias voltage bias1 may be used by another internal voltage generation circuit and the like. The power supply circuit 110A illustrated in FIG. 20 includes a negative voltage generation circuit 161, a delay circuit 162, and an intermediate voltage generation circuit 163. The power supply circuit 110A may have a configuration substantially similar to that of the power supply circuit illustrated in FIG. 13.

The negative voltage generation circuit 161 generates a negative voltage VNEG while the intermediate voltage generation circuit 163 generates an intermediate voltage VHLF. The delay circuit 162 delays an input signal in, thereby generating an output signal out. The bias voltage bias1 which is an output of the bias generation circuit 118 is supplied to the VPP generation circuit 14, the negative voltage generation circuit 161, the delay circuit 162, and the intermediate voltage generation circuit 163. The bias voltage bias1 may also be supplied to capacitive elements C installed in the circuits. For example, in the VPP generation circuit 14, the capacitive element 69, illustrated in FIG. 7, may correspond to the capacitive element C. The total capacitive value of the capacitive elements C in the circuits may determine a drop rate of the bias voltage bias1 at power-up.

As the bias voltage bias1 is set to the voltage value of bias0, the negative voltage generation circuit 161 and intermediate voltage generation circuit 163 detect changes in monitored voltages at a given response speed. The delay circuit 162 has a given delay time corresponding to the bias voltage bias1.

Figure 21:
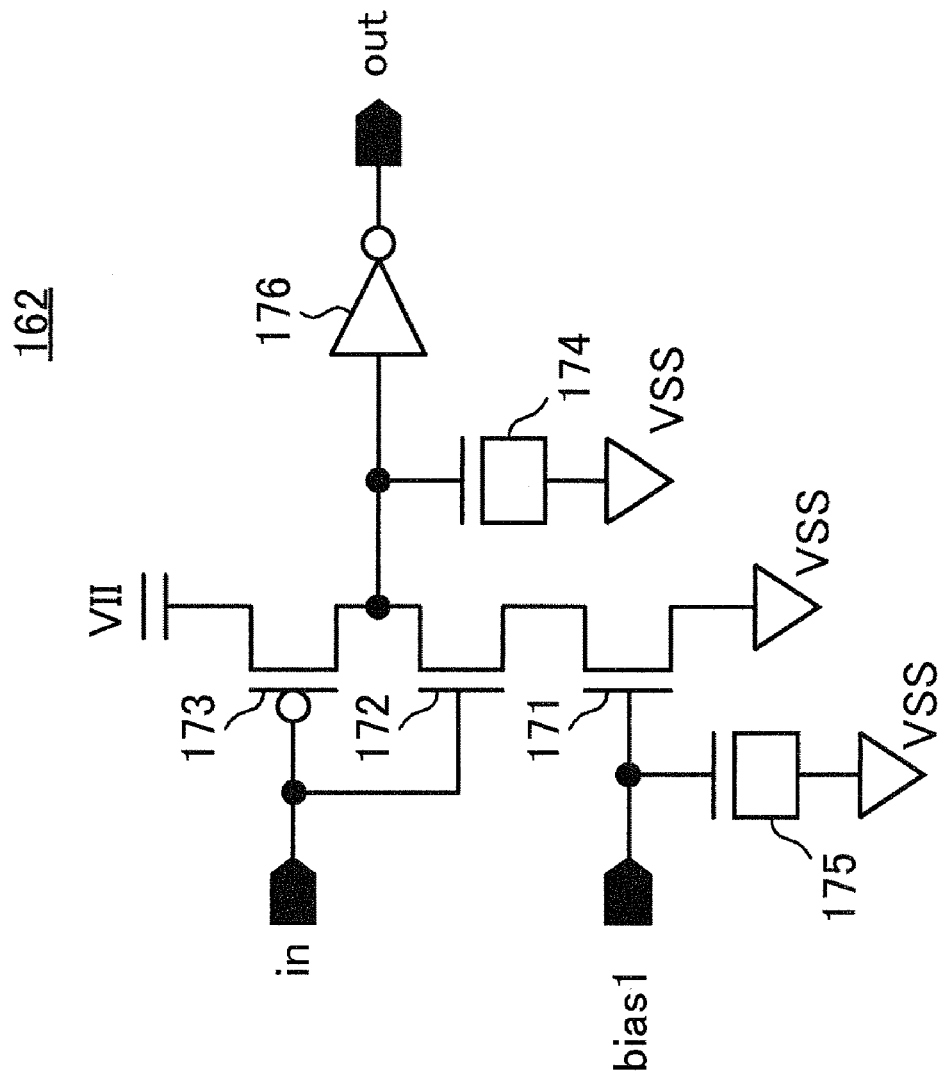
FIG. 21 illustrates an exemplary a delay circuit.

FIG. 21 illustrates an exemplary delay circuit. The delay circuit 162 includes NMOS transistors 171 and 172, a PMOS transistor 173, capacitive elements 174 and 175, and an inverter 176. Since the bias voltage bias1 is applied to a gate terminal of the NMOS transistor 171, an amount of current flowing from the capacitive element 174 to ground through the NMOS transistor 172 is set to a desired value. An amount of delay when the input signal (in) is delayed and output as the output signal (out) is set according to the bias voltage bias1. The capacitive element 175 may correspond to the capacitive element C of the delay circuit 162 illustrated in FIG. 20.

Figure 22:
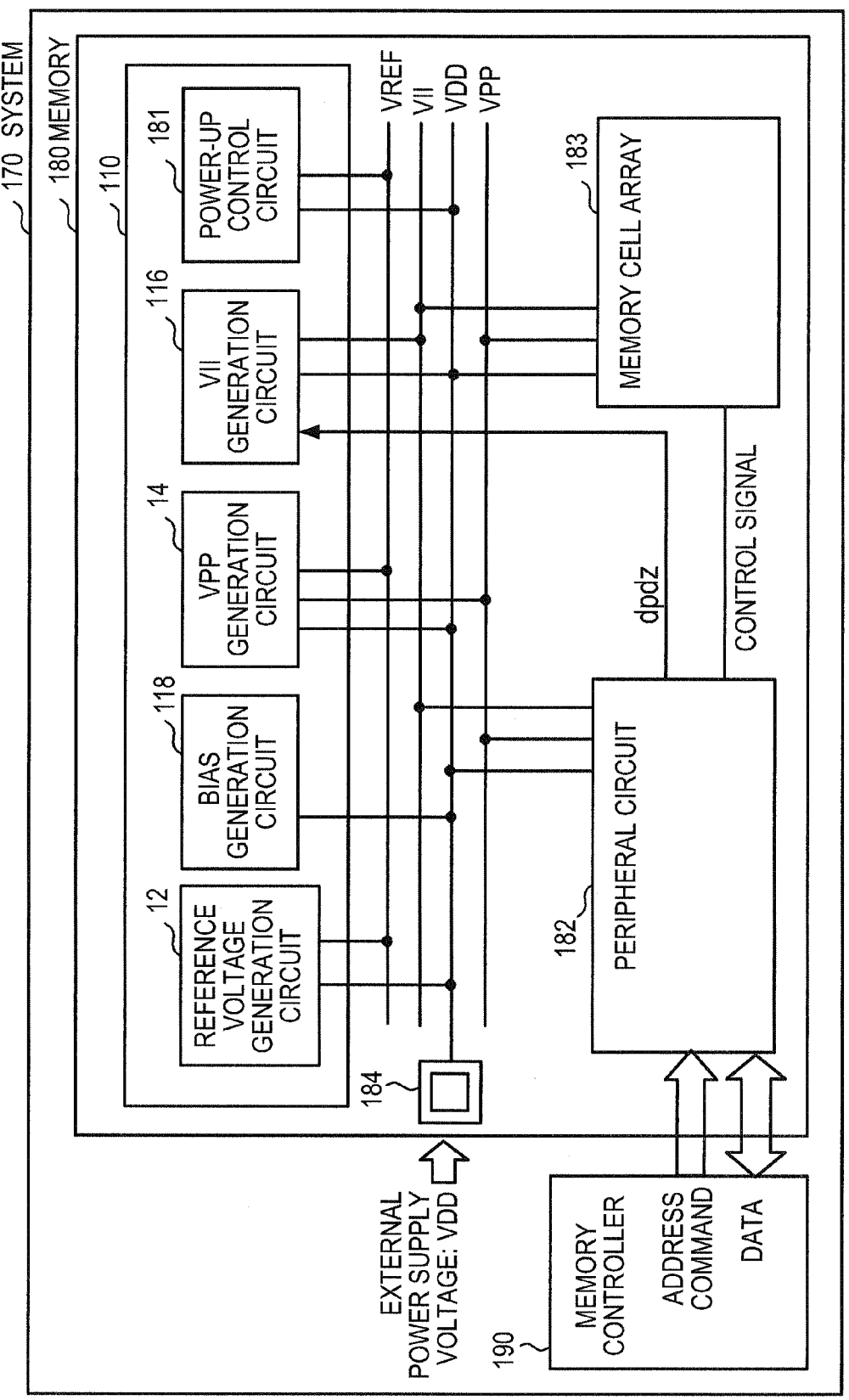
FIG. 22 illustrates an exemplary a system.

FIG. 22 illustrates an exemplary system. In FIG. 22, the same elements as those in FIG. 13 are denoted by the same reference numerals as the corresponding elements in FIG. 13, and description thereof will be omitted or reduced. The system 170 includes a semiconductor integrated circuit including a power supply circuit 110 such as a memory 180 and a memory controller 190 which controls the memory 180. The memory 180 includes the power supply circuit 110, a peripheral circuit 182, and a memory cell array 183.

The power supply circuit 110 includes the reference voltage generation circuit 12, bias generation circuit 118, VPP generation circuit 14, and VII generation circuit 116, which are illustrated in FIG. 13. A power-up control circuit 181 may correspond to the VDD start detection circuit 11, vref start detection circuit 13, and VII start detection circuit 17, which are illustrated in FIG. 13. During power-up, when the external power supply voltage VDD is applied to an external power supply terminal 184, an internal voltage is generated by the power-up sequence illustrated in FIG. 16. The power-up control circuit 181 generates a start signal sttz and supplies the start signal sttz to the peripheral circuit 182 and memory cell array 183.

Data write and data read operations to/from the memory 180 are performed under the control of the memory controller 190. If the memory controller 190 specifies, for example, the standby mode, the active mode, the deep power-down mode, or the like to the memory 180, the memory 180 enters the specified mode. For example, in the deep power-down mode, the control signal dpdz output from the peripheral circuit 182 becomes a high level, and the internal voltage VII stops being supplied from the VII generation circuit 116 illustrated in FIG. 11.

Figure 23:
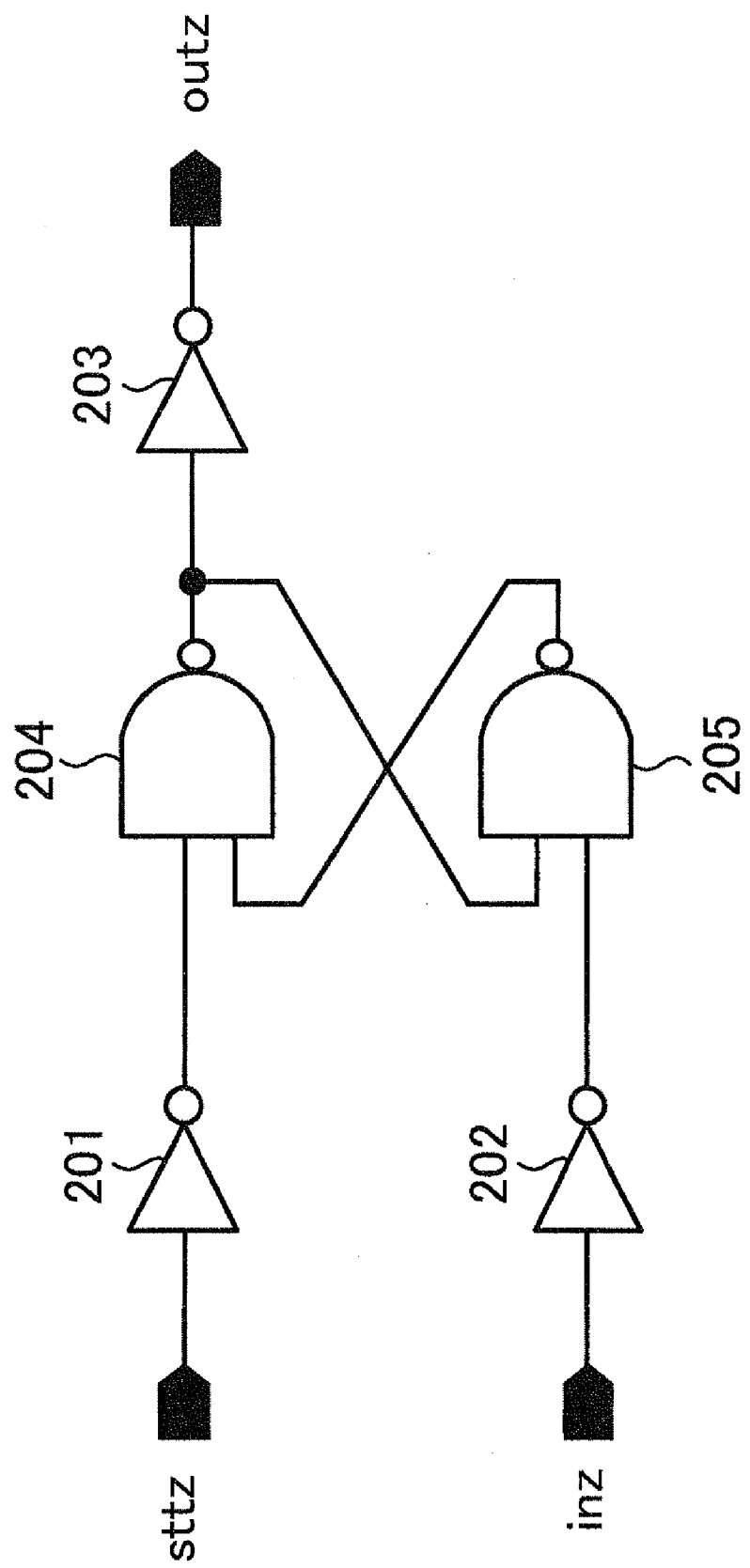
FIG. 23 illustrates an exemplary a latch.

FIG. 23 illustrates an exemplary latch. The latch illustrated in FIG. 23 may be initialized by a start signal. The latch includes inverters 201 to 203 and NAND gates 204 and 205. The inverters 201 to 203 as well as NAND gates 204 and 205 may be driven, for example, by the external power supply voltage VDD or the internal voltage VII. Output from each of the NAND gates 204 and 205 is coupled to input of the other. The latch is provided in the peripheral circuit 182 and memory cell array 183 in FIG. 22 and is initialized at power-up.

In FIG. 23, when the external power supply voltage VDD reaches a given level during power-up, a gate element of the latch is driven. In an initial state after power-up, since the start signal sttz is a high level, output of the NAND gate 204 becomes a high level, thereby, for example, an output outz becoming a low level and the latch being initialized. When the start signal sttz becomes a high level, output of the inverter 201 becomes a high level. If the input signal inz is a low level, the output outz remains a low level. When the system 170 operates, the input signal inz becomes a high level at a given timing. When the input signal inz becomes a high level, state of the latch is inverted, and the output outz becomes a high level. For example, if the latch is not initialized in response to the start signal sttz, the state of the latch may become indeterminate during power-up. For example, if the latch is initialized during power-up, as the latch in FIG. 23, the circuit operates reliably.

Example aspects of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The invention claimed is:

1. A semiconductor device comprising:
an external power supply detection circuit configured to detect that an external power supply is turned on and output a first detection signal;
an internal power supply voltage generation circuit configured to generate an internal power supply voltage based on the external power supply;
a reference voltage generation circuit configured to generate a first reference voltage in response to the first detection signal;
a reference voltage detection circuit configured to detect that the first reference voltage reaches a given level and output a second detection signal;
a bias voltage generation circuit configured to generate, in response to the second detection signal, a bias voltage to which a capacitive element is coupled as a load, based on a second reference voltage dependent on the first reference voltage; and
a power supply voltage detection circuit configured to compare, in response to the second detection signal, the bias voltage with a third reference voltage dependent on one of an external power supply voltage and the internal power supply voltage, and output a start signal.

2. The semiconductor device according to claim 1, wherein the bias voltage generation circuit includes a clamp circuit configured to clamp the bias voltage at a given level when the second detection signal is not supplied.

3. The semiconductor device according to claim 2, wherein the clamp circuit includes a diode-coupled transistor an end of which is coupled to the external power supply.

4. The semiconductor device according to claim 1, wherein the bias voltage generation circuit includes a first amplifier circuit configured to receive the second reference voltage and the bias voltage in response to the second detection signal.

5. The semiconductor device according to claim 1, wherein the bias voltage generation circuit includes a first differential amplifier circuit configured to cause the bias voltage to fall in response to the second detection signal.

6. The semiconductor device according to claim 5, wherein the bias voltage generation circuit includes:
a first transistor coupled to a source of the first differential amplifier circuit; and
a second transistor coupled to an end of the first transistor.

7. The semiconductor device according to claim 1, wherein the power supply voltage detection circuit includes a second differential amplifier circuit configured to start comparing the bias voltage with the third reference voltage based on the second detection signal.

8. The semiconductor device according to claim 1, wherein the power supply voltage detection circuit includes a resistor array configured to generate the monitor voltage and receives one of the external power supply voltage and the internal power supply voltage.

9. The semiconductor device according to claim 1, wherein the power supply voltage detection circuit adjusts an output timing of the start signal by adjusting the third reference voltage.

10. The semiconductor device according to claim 7, wherein the power supply voltage detection circuit includes a circuit configured to stop the power supply voltage detection circuit after the start signal is output.

11. The semiconductor device according to claim 10, wherein the power supply voltage detection circuit includes:
a latch circuit configured to latch the start signal; and
a delay circuit configured to delay an output of the latch circuit and supply the delayed signal to the second differential amplifier circuit.

12. The semiconductor device according to claim 1, wherein the internal power supply voltage generation circuit includes a transistor one end of which is coupled to the external power supply and the other end of which outputs the internal power supply voltage.

13. The semiconductor device according to claim 1, wherein the external power supply detection circuit changes a state of the first detection signal in response to a power-down control signal.

14. The semiconductor device according to claim 1, wherein the reference voltage detection circuit changes a state of the second detection signal in response to a power-down control signal.

15. A start control method for a semiconductor device, comprising:
generating a first reference voltage by detecting that an external power supply is turned on;
generating an internal power supply voltage based on the external power supply;
generating a bias voltage, to which a capacitive element is coupled as a load, based on a second reference voltage dependent on the first reference voltage by detecting that the first reference voltage reaches a given level;
comparing the bias voltage with a monitor voltage dependent on one of an external power supply voltage and the internal power supply voltage by detecting that the first reference voltage reaches a given level; and
starting an internal circuit.

16. The start control method according to claim 15, wherein the internal power supply voltage is generated by clamping the external power supply by a transistor.

17. The start control method according to claim 15, wherein the bias voltage is decreased from one of the external power supply voltage and the internal power supply voltage by detecting that the first reference voltage reaches a given level.

18. The start control method according to claim 15, wherein the bias voltage and the monitor voltage are compared and when the bias voltage and monitor voltage become substantially equal to each other, a start signal is output to start the internal circuit.

19. A system which includes a controller and a semiconductor device controlled by the controller, the semiconductor device comprising:
an external power supply detection circuit configured to detect that an external power supply is turned on and output a first detection signal;
an internal power supply voltage generation circuit configured to generate an internal power supply voltage based on the external power supply;
a reference voltage generation circuit configured to generate a first reference voltage in response to the first detection signal;
a reference voltage detection circuit configured to detect that the first reference voltage reaches a given level and output a second detection signal;
a bias voltage generation circuit configured to generate, in response to the second detection signal, a bias voltage to which a capacitive element is coupled as a load, based on a second reference voltage dependent on the first reference voltage; and
a power supply voltage detection circuit configured to compare, in response to the second detection signal, the bias voltage with a third reference voltage dependent on one of an external power supply voltage and the internal power supply voltage, and output a start signal.

20. The system according to claim 19, wherein the bias voltage generation circuit includes a clamp circuit configured to clamp the bias voltage to a given level when the second detection signal is not supplied.

* * * * *